(12) United States Patent
Nishimura et al.

(10) Patent No.: US 10,309,601 B2
(45) Date of Patent: Jun. 4, 2019

(54) LIGHT SOURCE DEVICE, LIGHTING APPARATUS, AND VEHICLE LAMP DEVICE

(71) Applicant: MITSUBISHI ELECTRIC CORPORATION, Tokyo (JP)

(72) Inventors: Masatoshi Nishimura, Tokyo (JP); Akihiro Yamada, Tokyo (JP); Jun Kondo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/764,820

(22) PCT Filed: Nov. 24, 2016

(86) PCT No.: PCT/JP2016/084785
§ 371 (c)(1),
(2) Date: Mar. 29, 2018

(87) PCT Pub. No.: WO2017/090675
PCT Pub. Date: Jun. 1, 2017

(65) Prior Publication Data
US 2018/0266638 A1    Sep. 20, 2018

(30) Foreign Application Priority Data

Nov. 27, 2015   (JP) .................. 2015-231589

(51) Int. Cl.
*F21V 5/04*     (2006.01)
*F21V 7/22*     (2018.01)
(Continued)

(52) U.S. Cl.
CPC .......... *F21S 41/125* (2018.01); *F21S 41/285* (2018.01); *F21S 43/14* (2018.01); *F21S 43/26* (2018.01);
(Continued)

(58) Field of Classification Search
CPC ........ F21S 41/125; F21S 41/285; F21S 43/40; F21S 43/14; F21S 43/26; F21V 9/30;
(Continued)

(56) References Cited

U.S. PATENT DOCUMENTS 4,657,397 A * 4/1987 Oehler .................. G01J 1/04
250/343
2009/0040598 A1    2/2009 Ito
(Continued)

FOREIGN PATENT DOCUMENTS

JP    2004-363060 A    12/2004
JP    2009-43668 A     2/2009
(Continued)

*Primary Examiner* — Mary Ellen Bowman
(74) *Attorney, Agent, or Firm* — Birch, Stewart, Kolasch & Birch, LLP

(57) ABSTRACT

A light source device includes a light source, a wavelength conversion member, and a retroreflective optical member. The light source emits excitation light. The wavelength conversion member includes a first region irradiated with the excitation light and radiates, from the first region, converted light having a wavelength different from that of the excitation light. The retroreflective optical member reflects the converted light toward the first region. The first region is a region that is a part of the wavelength conversion member.

20 Claims, 17 Drawing Sheets

(51) Int. Cl.
*F21S 41/20* (2018.01)
*F21S 43/14* (2018.01)
*F21S 43/20* (2018.01)
*F21S 43/40* (2018.01)
*G02B 27/09* (2006.01)
*G02B 5/126* (2006.01)
*H01L 33/50* (2010.01)
*H01L 33/60* (2010.01)
*F21S 41/125* (2018.01)
*F21Y 115/30* (2016.01)

(52) U.S. Cl.
CPC ............ *F21S 43/40* (2018.01); *F21V 5/04* (2013.01); *F21V 7/22* (2013.01); *G02B 5/126* (2013.01); *G02B 27/0972* (2013.01); *H01L 33/60* (2013.01); *F21Y 2115/30* (2016.08); *H01L 33/50* (2013.01)

(58) Field of Classification Search
CPC .. F21V 5/04; F21V 7/22; G02B 5/126; G02B 27/0972; H01L 33/50; F21Y 2115/30
See application file for complete search history.

(56) References Cited

U.S. PATENT DOCUMENTS

2011/0157865 A1 6/2011 Takahashi et al.
2011/0216550 A1 9/2011 Koike et al.

FOREIGN PATENT DOCUMENTS

| JP | 2009-266437 A | 11/2009 |
|---|---|---|
| JP | 2011-154995 A | 8/2011 |
| JP | 2011-181381 A | 9/2011 |
| JP | 2012-89316 A | 5/2012 |
| JP | 2013-222646 A | 10/2013 |

\* cited by examiner

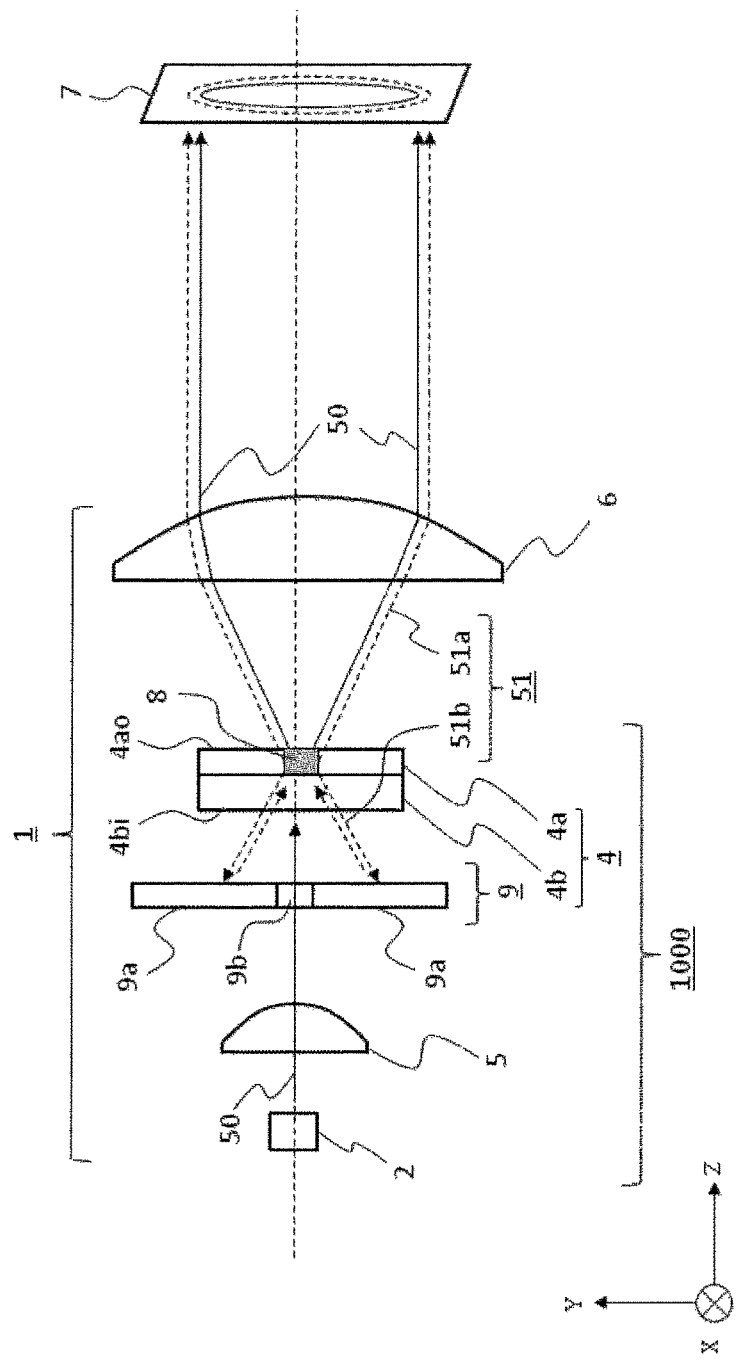

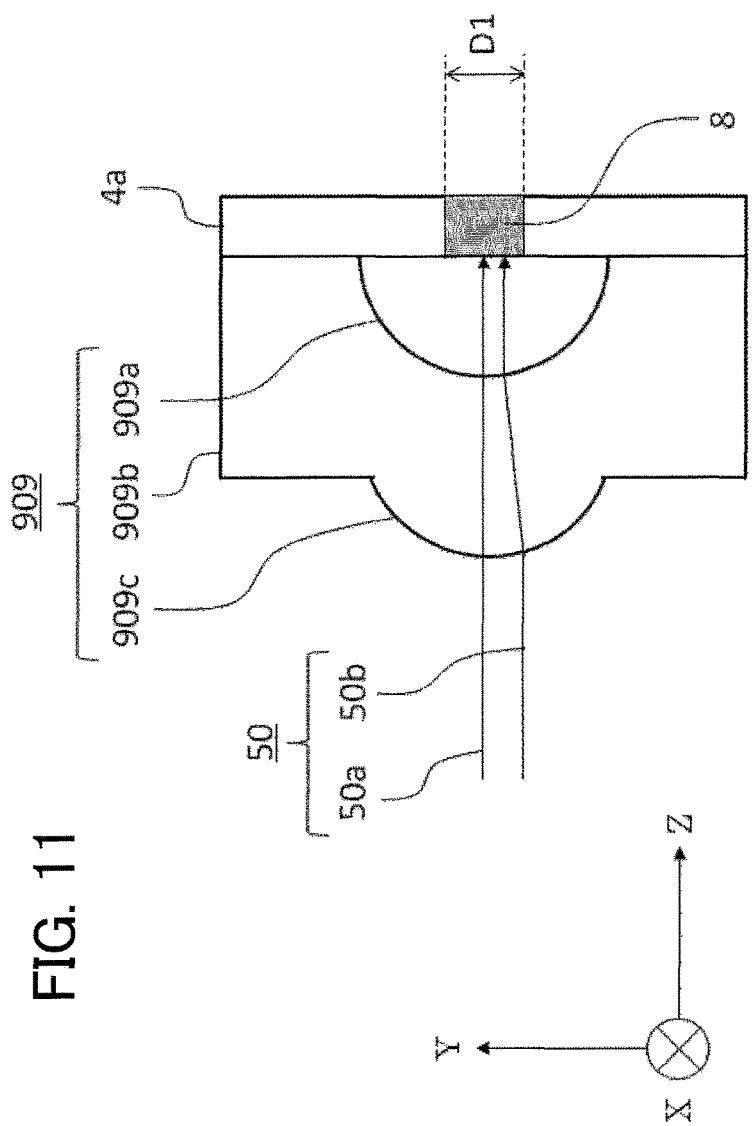

LIGHT SOURCE DEVICE, LIGHTING APPARATUS, AND VEHICLE LAMP DEVICE

TECHNICAL FIELD

The present invention relates to a light source device including a semiconductor light-emitting element and a wavelength conversion member, a lighting apparatus, and a vehicle lamp device.

BACKGROUND ART

Conventionally, a light source device including a semiconductor light-emitting element, a phosphor, and a wavelength selection filter has been known. The semiconductor light-emitting element is a light source that excites the phosphor. The semiconductor light-emitting element is, for example, a light emitting diode (LED), a laser diode (LD), or the like. For example, patent reference 1 proposes a vehicle lamp device capable of improving the light utilization efficiency by using a phosphor and a wavelength selection filter in the vehicle lamp device.

According to the technique described in patent reference 1, the vehicle lamp device irradiates the phosphor (a phosphor element) with blue light (excitation light), thereby obtaining yellow light (converted light) isotropically radiated from the phosphor. The converted light is fluorescence light emitted by the phosphor. The yellow light radiated from the phosphor in a direction opposite to an optical path traveling direction is reflected by the wavelength selection filter (a wavelength selection member) in the optical path traveling direction. In this way, the light utilization efficiency can be improved. In addition, the phosphor has a property of transmitting part of the blue light (the excitation light) instead of converting all the blue light (the excitation light) into the yellow light (the converted light). Thus, white light which is a mixture of the yellow light (the converted light) of the yellow wavelength and the blue light (the excitation light) of the blue wavelength can be obtained.

The "optical path traveling direction" is a direction in which the light emitted from the light source device, the vehicle lamp device, or the like travels. Namely, the "optical path traveling direction" is a light traveling direction on the optical path.

PRIOR ART REFERENCE

Patent Reference

PATENT REFERENCE 1: Japanese Patent Application Publication No. 2009-266437

SUMMARY OF THE INVENTION

Problem to be Solved by the Invention

However, the yellow light (the converted light) radiated from the phosphor in a direction opposite to the optical path traveling direction is reflected in the optical path traveling direction by the wavelength selection filter. In addition, the blue light (the excitation light) radiated from the phosphor in the direction opposite to the optical path traveling direction passes through the wavelength selection filter.

Thus, the light radiated from the phosphor in the direction opposite to the optical path traveling direction and reflected by the wavelength selection filter is reflected light having only the wavelength of the yellow light (the converted light).

In contrast, the synthesized light (the white light) is light obtained by synthesizing the blue light (the excitation light) and the yellow light (the converted light). In other words, the synthesized light (the white light) has a wavelength different from that of the reflected light. The different wavelength is the wavelength of the blue light (the excitation light).

Further, according to the technique described in patent reference 1, regarding the reflected light reflected by the wavelength selection filter, if a light ray is reflected by the wavelength selection filter at a large angle of reflection, the light ray reaches a wide area on the phosphor. In this case, the size of a light source image formed by the reflected light on the phosphor is larger than the size of a light source image formed by the synthesized light on the phosphor. In other words, the light source image formed on the phosphor has the wavelength of the synthesized light at the center and has the wavelength of the reflected light at the periphery. For example, white light is radiated from the center of the phosphor, and yellow light is radiated from the periphery. Thus, color unevenness appears on a surface illuminated by the vehicle lamp device.

Here, the "light source image" indicates a light emission region on an optical path traveling direction side regarding the light emitted from the phosphor. In other words, it is indicated that the region famed by the reflected light is larger than the region formed by the synthesized light emitted from the phosphor.

The present invention has been made to solve the above problem, and it is an object of the present invention to provide a light source device and a vehicle lamp device that improve the light utilization efficiency and reduce color unevenness.

Means of Solving the Problem

A light source device according to the present invention includes: a light source to emit excitation light; a wavelength conversion member including a first region which is irradiated with the excitation light, converted light having a wavelength different from a wavelength of the excitation light being radiated from the first region; and a retroreflective optical member to reflect the converted light to the first region, wherein the first region is a region that is a part of the wavelength conversion member.

Effects of the Invention

According to the present invention, it is possible to provide a light source device and a vehicle lamp device capable of improving the light utilization efficiency and suppressing occurrence of color unevenness.

BRIEF DESCRIPTION OF THE DRAWINGS

FIG. 1 is a configuration diagram schematically illustrating main components of a vehicle lamp device according to embodiment 1 of the present invention.

FIG. 2 2B shows schematic diagrams illustrating a configuration and light ray paths according to embodiment 1.

FIG. 11 is a configuration diagram illustrating another example of the retroreflective structure according to embodiment 2.

MODE FOR CARRYING OUT THE INVENTION

Figure 2A:
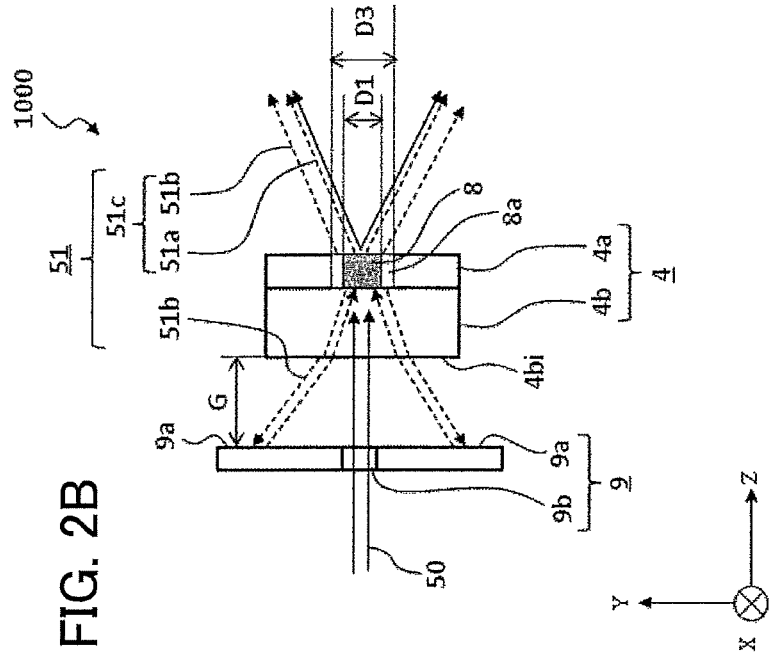
FIG. 2A shows a conventional art.

The following embodiments will be described by taking a vehicle lamp device as an example. However, as will be described below, a light source device in the present application can also be used as a general lighting apparatus. In particular, the light source device can also be used for partial illumination or the like in which an illumination area is limited to a part of a region.

Embodiment 1

FIG. 1 is a configuration diagram schematically illustrating main components of a vehicle lamp device 1 according to embodiment 1 of the present invention. Hereinafter, embodiment 1 of the present invention will be described with reference to the drawings.

The following embodiments will be described by using the XYZ coordinate system to facilitate the description. The X axis corresponds to a right-left direction when one views in the optical path traveling direction of the vehicle lamp device 1. The +X axis direction corresponds to the left side and the X axis direction corresponds to the right side when one views in the optical path traveling direction of the vehicle lamp device 1. The Y axis corresponds to an up-down direction of the vehicle lamp device 1. The +Y axis direction corresponds to the upper side and the Y axis direction corresponds to the lower side. For example, this "upper side" indicates the direction of the sky, and the "lower side" indicates the direction of the ground. The Z axis corresponds to the front-back direction of the vehicle lamp device 1. The +Z axis direction is the forward direction and the −Z axis direction is the backward direction. The +Z axis direction is the optical path traveling direction. The XYZ coordinate system will also be used in the description of light source devices 1000 and 1090 and 1130 according to the other embodiments described below, to facilitate the description.

As illustrated in FIG. 1, the light source device 1000 according to the present embodiment 1 includes a semiconductor light-emitting element 2, a condenser optical member 5, a retroreflective optical member 9, and a wavelength conversion member 4. The vehicle lamp device 1 includes the light source device 1000 and a projection optical member 6.

"Retroreflection" is a phenomenon in which light that has been incident on an object is reflected back toward a light incident direction. Namely, "retroreflection" is a phenomenon in which incident light is reflected back toward the light incident direction. For example, light that has been incident on a glass bead at an incident angle $A_{in}$ is refracted on its surface, reflected inside the glass bead, refracted on the surface again, and leaves the glass bead. Since the incident angle $A_{in}$ finally becomes equal to an exit angle $A_{out}$, the light is returned toward the light incident direction.

(Configurations of Vehicle Lamp Device 1 and Light Source Device 1000)

The semiconductor light-emitting element 2 is a light source for exciting the wavelength conversion member 4. For example, the semiconductor light-emitting element 2 is a light emitting diode (LED), a laser diode (LD), or the like. The semiconductor light-emitting element 2 emits excitation light 50. The excitation light 50 is, for example, blue light having a center wavelength within a range from 435 nm to 480 nm. Alternatively, the excitation light 50 may be, for example, ultraviolet light having a center wavelength within a range from 355 nm to 405 nm.

The wavelength conversion member 4 includes a phosphor part 4a. In addition, the wavelength conversion member 4 may include a phosphor supporting member 4b. In FIG. 1, for example, the wavelength conversion member 4 is shaped like a plate parallel to the XY plane.

The phosphor part 4a is excited by the excitation light 50. The excited phosphor part 4a radiates converted light 51. The converted light 51 is fluorescence light.

The excitation light 50 is radiated from the semiconductor light-emitting element 2. The converted light 51 has a wavelength different from that of the excitation light 50. Of the converted light 51, converted light 51a is light radiated in the +Z axis direction from the phosphor part 4a. Of the converted light 51, converted light 51b is light radiated in the −Z axis direction from the phosphor part 4a.

When the semiconductor light-emitting element 2 that emits blue light as the excitation light 50 is used, a phosphor that is excited by the blue light and radiates yellow light is used as the phosphor part 4a. Thus, the converted light 51 becomes yellow light having a center wavelength within a range from 500 nm to 600 nm, for example. Yellow is the complementary color for blue.

In this case, instead of the phosphor that emits yellow light, a phosphor which is a mixture of a phosphor that emits green light and a phosphor that emits red light may be used. If the semiconductor light-emitting element 2 that emits ultraviolet light is used, a phosphor which is a mixture of three kinds of phosphors for blue, green and red may be used.

The phosphor part 4a is not necessarily required to convert all the excitation light 50 into the converted light 51. Namely, the phosphor part 4a converts part of the excitation light 50 into the converted light 51.

In addition, the phosphor part 4a transmits part of the excitation light 50. The phosphor part 4a scatters part of the excitation light 50 that is transmitted. The phosphor part 4a diffuses and transmits part of the excitation light 50. In this case, light in which the wavelength of the excitation light 50 and the wavelength of the converted light 51 are mixed can be obtained.

The vehicle lamp device 1 can output white light having a color temperature of 6500 K from yellow light (the converted light 51) having a color temperature of 2500 K, for example. To output white light from yellow light (the converted light 51), for example, blue light (the excitation light 50) is needed. Namely, the wavelength of the excitation light 50 is shorter than that of the converted light 51.

The phosphor supporting member 4b is a supporting member on which the phosphor part 4a is applied. In FIG. 1, the phosphor supporting member 4b is disposed on the −Z axis side of the phosphor part 4a. Namely, the excitation light 50 passes through the phosphor supporting member 4b and reaches the phosphor part 4a.

The phosphor supporting member 4b has high transmittance. Namely, the phosphor supporting member 4b allows the excitation light 50 and the converted light 51 to pass through.

Further, it is desirable that the phosphor supporting member 4b have heat resistance. For example, the phosphor supporting member 4b is a heat-resistant glass member.

When side surfaces of the phosphor part 4a are held, the phosphor supporting member 4b may be absent. In addition, when a means using a phosphor part 4a shaped like a plate is adopted, the phosphor supporting member 4b may be absent.

The condenser optical member 5 is an optical system that condenses the excitation light 50 on the phosphor part 4a. The condenser optical member 5 is, for example, a lens. In other words, the condenser optical member 5 is, for example, a condenser lens.

The condenser optical member 5 makes an incident region when condensed luminous flux reaches the wavelength conversion member 4 smaller than an incident region when luminous flux reaches the condenser optical member 5. The condenser optical member 5 makes an incident region when the condensed luminous flux reaches the phosphor part 4a smaller than the incident region when the luminous flux reaches the condenser optical member 5. In a case of the luminous flux shaped like a circle, the condenser optical member 5 makes the luminous flux diameter of the condensed luminous flux when it reaches the phosphor part 4a smaller than the luminous flux diameter of the luminous flux when it reaches the condenser optical member 5.

In FIG. 1, the condenser optical member 5 is disposed on the +Z axis side of the semiconductor light-emitting element 2. Further, the condenser optical member 5 is disposed on the −Z axis side of the wavelength conversion member 4. The condenser optical member 5 is disposed on the −Z axis side of the retroreflective optical member 9 described below. Namely, the condenser optical member 5 is disposed between the semiconductor light-emitting element 2 and the retroreflective optical member 9.

The excitation light 50 emitted from the semiconductor light-emitting element 2 enters the condenser optical member 5. The condenser optical member 5 emits the excitation light 50 to the wavelength conversion member 4. The condenser optical member 5 converts the excitation light 50 into condensed light. The light condensed by the condenser optical member 5 reaches the phosphor part 4a.

The condenser optical member 5 in FIG. 1 is a plano-convex lens, for simplicity. The condenser optical member 5 may be a double-convex lens. Alternatively, the condenser optical member 5 may be famed by using a plurality of lenses. Alternatively, the condenser optical member 5 may be formed with using no lens. For example, the condenser optical member 5 may be formed by using a reflector, a reflecting mirror, a light pipe, or the like.

When a light pipe is used, the excitation light 50 is not condensed on the phosphor part 4a, but the excitation light 50 is guided to the phosphor part 4a. "To guide light" means guiding light to a distant position. Namely, the condenser optical member 5 is a guide member that guides the excitation light 50 to the phosphor part 4a. Thus the condenser optical member 5 guides the excitation light 50 to the position of a condensed light spot 8 on the phosphor part 4a.

For example, the light pipe guides light to a distant position by reflecting the light inside the light pipe. The light pipe is an optical element used for obtaining a uniform surface light source by reflecting light a plurality of times by side surfaces of a polygonal column or a polygonal pyramid. The light pipe is also referred to as a homogenizer. One type of light pipe is a hollow light pipe with side surfaces formed by mirrors; another type of light pipe is a light pipe which is a polygonal column made of a transparent substance such as glass and uses total reflection by its side surfaces. The former one is also called a light tunnel; the latter one is also called a rod The condenser optical member 5 condenses the excitation light 50 and forms the condensed light spot 8 on the phosphor part 4a. The smaller the size of the condensed light spot 8 is, the smaller the size of the projection optical system can be made. For example, it is preferable that the condensed light spot 8 have a diameter within a range from 0.2 mm to 2.0 mm. Further, the condensed light point is not necessarily needed to be on the phosphor part 4a. For example, by moving the condensed light point on the optical axis, the size of the condensed light spot 8 can be changed.

The condensed light spot 8 is a light source image famed on the wavelength conversion member 4.

It is not necessary for the condensed light spot 8 to have a circular shape. For example, the power in the X axis direction and the power in the Y axis direction of the condenser optical member 5 can be made different values. Namely, a toroidal lens may be used as the condenser optical member 5. Alternatively, a cylindrical lens may be used as the condenser optical member 5. Divergence angles of the excitation light 50 at a time of emission from the condenser optical member 5 can be made different in two directions perpendicular to the optical axis of the condenser optical member 5 and orthogonal to each other. Alternatively, for example, a non-spherical lens with the power in the X axis direction different from the power in the Y axis direction may be used as the condenser optical member 5. The power in the Y axis direction is larger than the power in the X axis direction.

The toroidal lens is a lens with a surface having different curvatures in two axis directions intersecting at right angles, such as a surface of a barrel or a surface of a donut. The cylindrical lens has a curvature in one direction (a first direction) and no curvature in a direction (a second direction) perpendicular to the one direction (the first direction). When light is incident on the cylindrical lens, the light converges or diverges in only one direction. When parallel light is incident on a convex-shaped cylindrical lens, the light is collected to form a line of light. This line of the collected light is referred to as a focal line. Furthermore, a toroidal lens includes a cylindrical lens.

In addition, for example, the shape of an exit surface of the light pipe may be a shape other than a circular shape or a square shape. Namely, for example, the shape of the exit surface of the light pipe may be an ellipse shape, a rectangular shape, or the like.

With these components, the shape of the luminous pattern projected by the projection optical member 6 can be changed. The luminous pattern is the shape of a region on the phosphor part 4a from which light rays are emitted. The light rays emitted from the phosphor part 4a are the excitation light 50 and the converted light 51. In the embodiment, the region formed on the phosphor part 4a is illustrated as the condensed light spot 8, for example.

By forming a light distribution pattern on the phosphor part 4a, for example, a light distribution pattern used for a vehicle lamp device can be formed easily.

The light distribution pattern used for a vehicle lamp device has, for example, a shape that is long in the horizontal direction and short in the vertical direction. Thus, for example, by forming a rectangular-shaped luminous region on the phosphor part 4a, it can be used for a vehicle lamp device. Alternatively, for example, by forming an ellipse-shaped luminous region on the phosphor part 4a, it can be used for a vehicle lamp device.

In addition, by forming variously-shaped light distribution patterns, the present embodiment can be easily used for illumination for illuminating a limited area. For example, by projecting a light distribution pattern formed on the phosphor part 4a, a lighting apparatus that illuminates a part of a wall can be realized easily.

Figure 17:
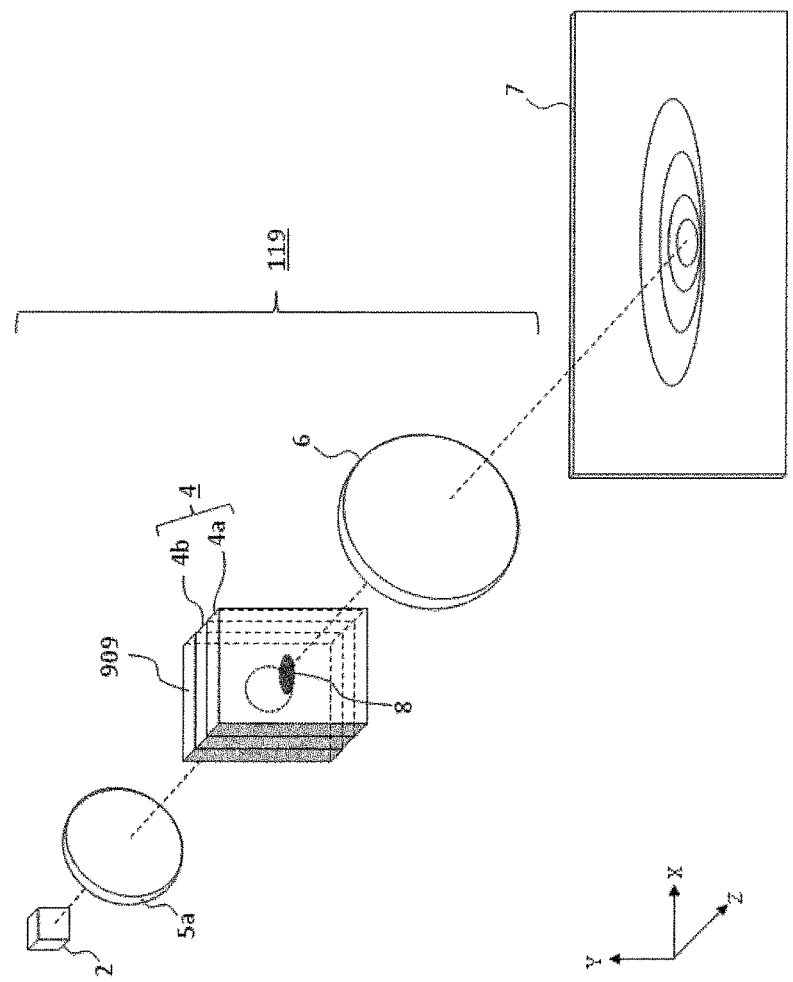
FIG. 17 is a configuration diagram schematically illustrating main components of a vehicle lamp device forming an ellipse-shaped condensed light spot according to embodiment 1 of the present invention.

FIG. 17 is a configuration diagram schematically illustrating main components of a vehicle lamp device 119 forming an ellipse-shaped condensed light spot 8.

Figure 9:
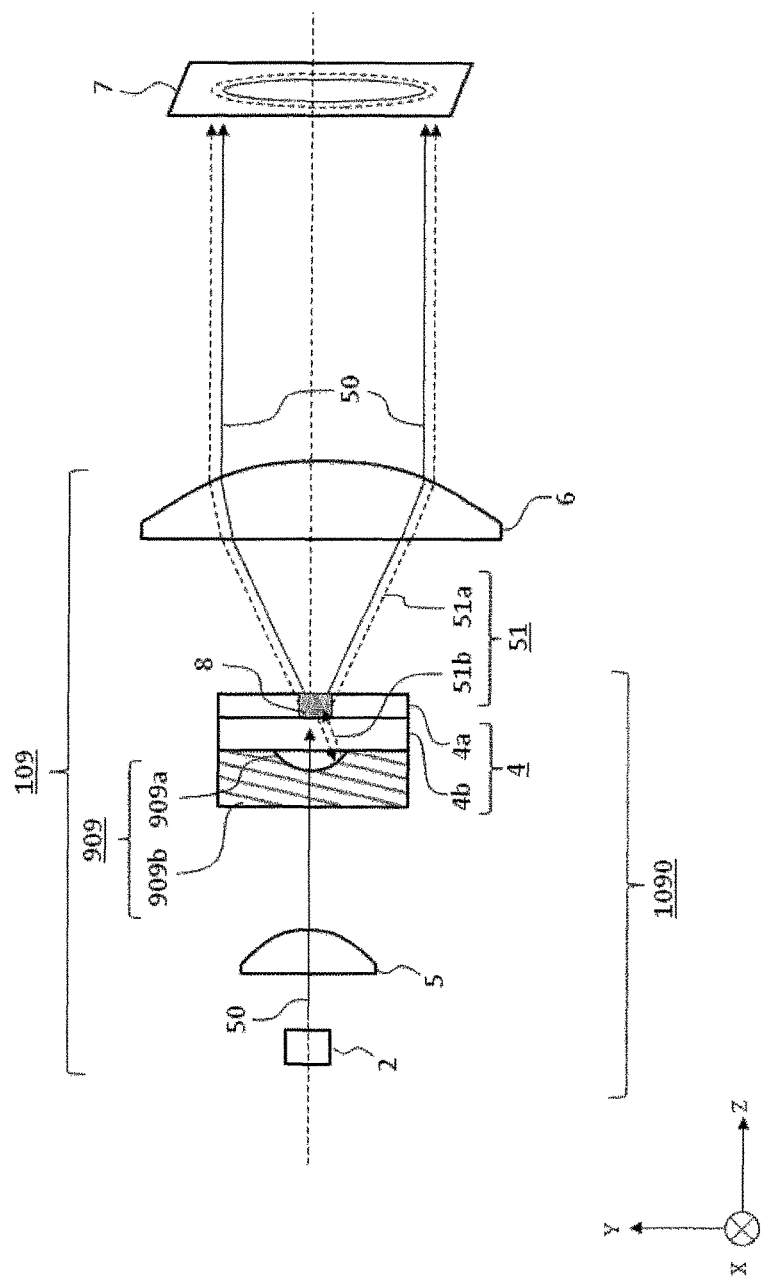
FIG. 9 is a configuration diagram schematically illustrating main components of a vehicle lamp device according to embodiment 2 of the present invention.

FIG. 17 illustrates an example where a condenser optical member 5 of a vehicle lamp device 109 illustrated in FIG. 9 is changed. With respect to a condenser optical member 5a of a vehicle lamp device 119, at a time of emission from the condenser optical member 5a, divergence angles of the excitation light 50 are different in two directions that are perpendicular to the optical axis of the condenser optical member 5a and orthogonal to each other. In FIG. 17, the divergence angle in the X axis direction is larger than the divergence angle in the Y axis direction. For example, the condenser optical member 5a is a toroidal lens.

The condensed light spot 8 formed on the phosphor part 4a has an ellipse shape. In FIG. 17, the X axis direction corresponds to the major axis and the Y axis direction corresponds to the minor axis. The projection optical member 6 projects the ellipse-shaped luminous pattern famed on the phosphor part 4a onto an illuminated surface 7.

When the excitation light 50 does not need to be condensed, such as when the semiconductor light-emitting element 2 is a laser element or the like, the condenser optical member 5 may be omitted.

The projection optical member 6 is an optical system that projects the excitation light 50 that has passed through the phosphor part 4a and the converted light 51 that has been radiated from the phosphor part 4a onto the illuminated surface 7. For example, the projection optical member 6 is a projector lens.

The excitation light 50 is diffused, for example, when the excitation light 50 passes through the phosphor part 4a. The converted light 51 is isotropically radiated from the phosphor part 4a, for example. "Isotropically" means that a property or distribution of an object does not depend on a direction. Here, it means that the amount of radiation of the converted light 51 does not depend on directions. Namely, the light distribution of the converted light 51 is a Lambertian light distribution. In the Lambertian light distribution, the directivity of the light distribution is wide and the luminance on a luminous surface is substantially even irrespective of view directions.

For example, the luminous surface of the phosphor part 4a and the illuminated surface 7 are in optically conjugate positions. Namely, the position in the Z axis direction of the focal point of the projection optical member 6 matches the position in the Z axis direction of the phosphor part 4a. The focal point of the projection optical member 6 is located on a surface including a +Z axis side surface 4ao of the phosphor part 4a. The position in the Z axis direction of the phosphor part 4a is, for example, the position of the +Z axis side surface 4ao of the phosphor part 4a. The +Z axis side surface 4ao of the phosphor part 4a is an exit surface of the phosphor part 4a. In this case, a light source image on the phosphor part 4a is projected on the illuminated surface 7.

The projection optical member 6 in FIG. 1 is a plano-convex lens, for simplicity. However, the projection optical member 6 may be a double-convex lens. Alternatively, the projection optical member 6 may be formed by using a plurality of lenses.

The illuminated surface 7 is an imaginary plane set at a predetermined position in front of the vehicle. The illuminated surface 7 is, for example, a surface parallel to the XY plane.

In a case of a vehicle lamp device, for example, the predetermined position (the illuminated surface 7) in front of the vehicle is a position where the brightness or the illuminance of the vehicle lamp device is measured. The position of the illuminated surface 7 is stipulated by road traffic rules, etc. For example, in Europe, the UNECE (United Nations Economic Commission for Europe) stipulates that the brightness of a vehicle lamp device needs to be measured at a position 25 m away from a light source. In Japan, the Japanese Industrial Standards Committee (JIS) stipulates that the brightness needs to be measured at a position 10 m away from a light source.

In a case of a lighting apparatus, the illuminated surface 7 is, for example, a wall, a floor, or the like. Thus, the illuminated surface 7 is not necessarily a plane perpendicular to the optical axis of the lighting apparatus.

The retroreflective optical member 9 includes a retroreflection part 9a and a transmission part 9b. The retroreflection part 9a is a part that retroreflects the converted light 51b radiated in the −Z axis direction from the phosphor part 4a. The transmission part 9b is a part that transmits the excitation light 50 emitted from the semiconductor light-emitting element 2.

The retroreflective optical member 9 is disposed, for example, between the condenser optical member 5 and the wavelength conversion member 4. "Between the condenser optical member 5 and the wavelength conversion member 4" indicates an optical path leading the excitation light 50 to the wavelength conversion member 6 from the condenser optical member 5.

In addition, the excitation light 50 can be emitted from a side direction between the retroreflective optical member 9 and the wavelength conversion member 4, to irradiate the phosphor part 4a. Here, the side direction is a direction perpendicular to the Z axis. For example, the wavelength conversion member 4 is irradiated with the excitation light 50 from an oblique direction. In addition, a reflection member is disposed, for example, between the retroreflective optical member 9 and the wavelength conversion member 4. Then, by reflecting the excitation light 50 emitted from the side direction by the reflection member, the phosphor part 4a can be irradiated with the reflected light. The reflection member can be disposed, for example, on the +Z axis side surface of the retroreflective optical member 9. Alternatively, the reflection member can be disposed, for example, at the position of the transmission part 9b in FIG. 1.

For example, the retroreflective optical member 9 is disposed to be firmly attached to an entrance surface 4bi of the wavelength conversion member 4. Alternatively, as illustrated in FIG. 1, the retroreflective optical member 9 may be disposed away from the wavelength conversion member 4.

Due to concentration of the excitation light 50, a part of the condensed light spot 8 of the excitation light 50 reaches a high temperature. Thus, to prevent deterioration of the retroreflective optical member 9 due to the heat, it is preferable that the retroreflective optical member 9 be disposed away from the wavelength conversion member 4. In this way, the converted light 51b can be received in a wide region on the retroreflective optical member 9.

In addition, to prevent temperature quenching and deterioration of the wavelength conversion member 4, the retroreflective optical member 9 is manufactured by using a heat radiation member having high thermal conductivity and is disposed to be in contact with the entrance surface 4bi of the wavelength conversion member 4. In this case, by using the retroreflective optical member 9, the heat can be released from the condensed light spot 8 partially reaching a high temperature. The "temperature quenching" is a phenomenon in which the amount of fluorescence light emission by the wavelength conversion member 4 decreases as the temperature rises.

The retroreflection part 9a is an optical part that retroreflects, to the condensed light spot 8, the converted light 51b radiated in the −Z direction, of the converted light 51 radiated from the condensed light spot 8 on the phosphor part 4a. In addition, while FIG. 1 illustrates the retroreflection part 9a having a planar shape, the retroreflection part 9a may have a curved surface shape.

The converted light 51b radiated in the −Z direction is radiated isotropically, for example. In this case, it is preferable that the retroreflection part 9a be formed to have a domical shape that covers the wavelength conversion member 4. In this way, the retroreflection part 9a can effectively retroreflect the converted light 51b without leakage light of the converted light 51b. The domical shape is, for example, a spherical surface shape having its center at the position of the condensed light spot 8.

The "leakage light" means light that reaches the outside of a range of an irradiation target, of light emitted from a light source of a lamp device. For example, the leakage light is light emitted in the −Z axis direction from the vehicle lamp device 1. As another example, the leakage light is light that reaches the outside of an irradiation region on the illuminated surface 7 or the like.

The transmission part 9b transmits light having the wavelength of the excitation light 50. The transmission part 9b transmits the excitation light 50. The excitation light 50 passes through the transmission part 9b.

In addition, the transmission part 9b may be replaced by a wavelength selection member that transmits light having the wavelength of the excitation light 50 and reflects light having the wavelength of the converted light 51. The transmission part 9b can transmit the converted light 51. In this case, since, of all the converted light 51b, the converted light 51b radiated from the condensed light spot 8 to the transmission part 9b can be utilized efficiently, the light utilization efficiency can be improved.

Alternatively, for example, the transmission part 9b may be an opening formed in the retroreflection part 9a. Alternatively, the transmission part 9b may be formed, for example, by disposing a member that transmits the excitation light 50 or the above wavelength selection member in an opening famed in the retroreflection part 9a.

The transmission part 9b can be formed as a region that does not have parts that retroreflect the converted light 51. The region that retroreflects the converted light 51 is, for example, a region in which spherical lenses 1003a, reflective films 1003d, etc. illustrated in FIG. 3 are disposed. In this case, for example, a lens fixing member 1003b and a base member 1003c of the retroreflection part 9 illustrated in FIG. 3 are formed by members that transmit the excitation light 50.

Each of the spherical lenses 1003a has a spherical surface shape. For example, each of the spherical lenses 1003a is formed by using a glass ball as a lens. The spherical lenses are also referred to as ball lenses.

To improve the light utilization efficiency, it is preferable to use a member having high transmittance for the transmission part 9b. The size of the transmission part 9b is equal to the beam diameter of the excitation light 50 when the excitation light 50 is transmitted by the transmission part 9b. Alternatively, the size of the transmission part 9b is larger than the beam diameter of the excitation light 50 by the amount including the tolerance that occurs in design.

The converted light 51b radiated in the −Z axis direction is retroreflected to travel in the +Z axis direction by the retroreflective optical member 9. Thus, the light utilization efficiency of the light source device 1000 is improved. In addition, the light utilization efficiency of the vehicle lamp device 1 is improved.

(Cause of Occurrence of Color Unevenness)

Figure 2B:
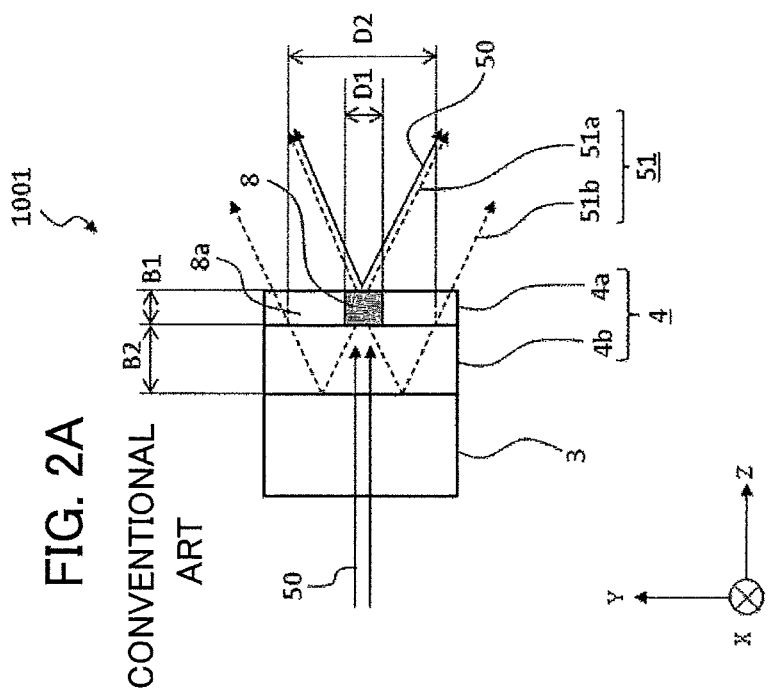

FIG. 2B shows schematic diagrams in which light ray paths inside the light source device 1000 according to embodiment 1 is illustrated. FIG. 2A illustrates a case of a light source device 1001 using a wavelength selection member 3. FIG. 2B illustrates a case of the light source device 1000 using the retroreflective optical member 9.

A cause of occurrence of color unevenness will be described in detail with reference to the schematic diagram in FIG. 2A. FIG. 2A illustrates a conventional art.

The wavelength selection member 3 in FIG. 2A reflects the converted light 51b radiated in the −Z direction, to travel in the +Z direction, of the converted light 51 isotropically radiated from the condensed light spot 8. In this case, a diameter D2 of a condensed light spot 8a formed by the reflected converted light 51b is larger than a diameter D1 of the condensed light spot 8. The difference between the diameters appears as color unevenness on the illuminated surface 7.

The configuration in FIG. 2B can reduce the color unevenness caused by the configuration in FIG. 2A.

The retroreflective optical member 9 in FIG. 2B retroreflects the converted light 51b. A diameter D3 of the condensed light spot 8a formed by the reflected converted light 51b is approximately equal to the diameter D1 of the condensed light spot 8 in size. The diameter D3 is smaller than the diameter D2. Therefore, the light source device 1000 can reduce the color unevenness that occurs due to the difference between the sizes of the light source images formed on the phosphor part 4a.

In addition, the converted light 51a radiated in the +Z direction from the phosphor part 4a and the converted light 51b retroreflected by the retroreflective optical member 9 and radiated in the +Z direction have the same angle of radiation. Namely, the angle of radiation of synthesized light 51c obtained by synthesizing the converted light 51a and the converted light 51b is the same as the angle of radiation of the original converted light 51a. Thus, in the configuration of the light source device 1000, the size of the light source image (the condensed light spot 8) formed by the excitation light 50 is equivalent to the size of the light source image formed by the converted light 51b.

For this reason, a light source having high luminous intensity is obtained. In addition, brightness unevenness of the light emitted from the light source device 1000 can be suppressed. Thus, illuminance unevenness on the illuminated surface 7 is reduced.

(Configuration of Retroreflective Optical Member 9)

FIGS. 3A to 3D show configuration diagrams of the retroreflective optical member 9 according to embodiment 1.

Figure 3A:
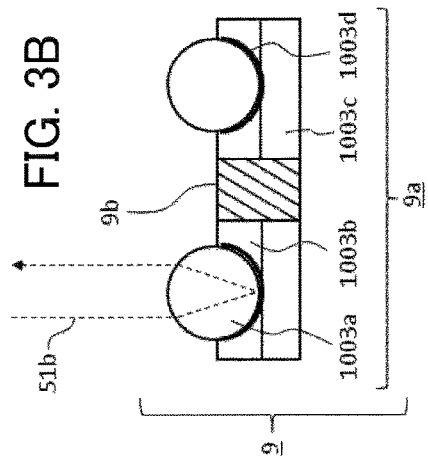
FIGS. 3A to 3D show configuration diagrams of a retroreflective optical member according to embodiment 1.
Figure 3B:
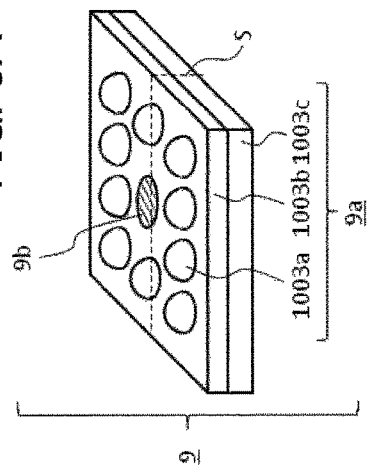
Figure 3C:
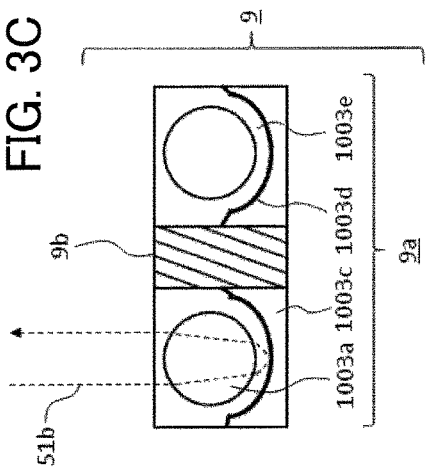
Figure 3D:
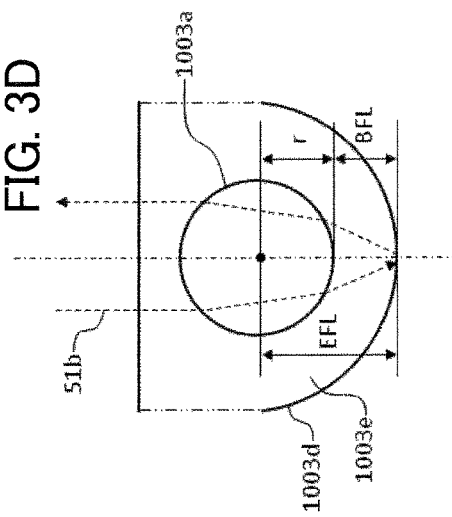

FIG. 3A is a schematic diagram illustrating an overall configuration of the retroreflective optical member 9. FIG. 3B is a configuration diagram of the retroreflective optical member 9 illustrated in FIG. 3A, as a view of a cross section S. FIG. 3C is a configuration diagram of the retroreflective optical member 9 illustrated in FIG. 3A, as a view of the cross section S. FIG. 3D is an explanatory diagram illustrating a relationship between a refractive index and a focal length of the spherical lens 1003a.

The retroreflective optical member 9 includes the retroreflection part 9a and the transmission part 9b.

The retroreflection part 9a includes, for example, the spherical lenses 1003a and the lens fixing member 1003b. The retroreflection part 9a can include the base member 1003c and the reflective films 1003d. For example, the spherical lenses 1003a having high refractive index are embedded in the retroreflection part 9a.

In FIG. 3B, the spherical lenses 1003a and the reflective films 1003d are in contact with each other. In this case, assuming that the refractive index is n, it is preferable that the refractive index of each of the spherical lenses 1003a be, for example, within a range of 1.8<n<2.0. This makes the focal point of the spherical lens 1003a located on a surface of the spherical lens 1003a. In this case, as long as the spherical lenses 1003a have the same refractive index n, the spherical lenses 1003a may be different in size.

In FIG. 3B, a light ray 51b indicates an optical path of light retroreflected by the retroreflection part 9a. After entering the spherical lens 1003a, the light ray 51b is refracted toward the center of the spherical lens 1003a. After travelling inside the spherical lens 1003a, the light ray 51b is reflected by the reflective film 1003d. After the reflection by the reflective film 1003d, the light ray 51b travels inside the spherical lens 1003a and is emitted from the spherical lens 1003a. At the time of the emission from the spherical lens 1003a, the light ray 51b is refracted so as to be parallel to the light ray 51b at the time of entering the spherical lens 1003a.

The lens fixing member 1003b is a fixing member for fixing the spherical lenses 1003a. The lens fixing member 1003b includes spherical surface-shaped concave parts for fixing the spherical lenses 1003a. Further, for example, an adhesive made of resin such as acrylic resin or silicone resin is applied on the concave parts of the lens fixing member 1003b.

The lens fixing member 1003b may be formed by using a material having a light absorption property. This makes it possible to prevent diffusion of the light incident on a region other than the spherical lenses 1003a on the lens fixing member 1003b.

The spherical lenses 1003a illustrated in FIG. 3 are disposed on a surface of the lens fixing member 1003b which has been formed to have a planar shape. However, the surface on which the spherical lenses 1003a are disposed is not limited to a flat surface.

For example, the lens fixing member 1003b may be formed to surround the condensed light spot 8. Namely, the lens fixing member 1003b is formed to surround the converted light 51b radiated in the −Z axis direction from the wavelength conversion member 4. In addition, the spherical lenses 1003a are disposed on a surface fainted to surround the converted light 51b radiated in the Z axis direction. For example, it is the shape like a concave surface that will be described in embodiment 2.

In this way, the converted light 51b radiated in the −Z axis direction from the wavelength conversion member 4 can be reflected in the direction of the condensed light spot 8. Thus, the light utilization efficiency can be improved.

The direction in which the converted light 51b is reflected depends on the spherical lenses 1003a. Thus, unlike embodiment 2, there is no need to take reflection of the converted light 51b into consideration, for determining the shape of the concave surface shape.

In addition, in a case of using microprisms or micromirrors as described below, as in the case of using the spherical lenses 1003a, the fixing member is famed to surround the converted light 51b radiated in the −Z axis direction from the wavelength conversion member 4.

For example, the base member 1003c is manufactured by using metal such as aluminum. Alternatively, for example, the base member 1003c is manufactured by using resin material such as acrylic resin.

When the retroreflective optical member 9 is disposed near a heat source, it is preferable that the base member 1003c be manufactured by using a material having high thermal conductivity. Here, the heat source is, for example, the semiconductor light-emitting element 2 or the wavelength conversion member 4 in FIG. 1, or the like.

The reflective films 1003d are formed on the surfaces of the concave parts of the lens fixing member 1003b. Alternatively, the reflective films 1003d can be formed on surfaces other than the surfaces of the concave parts on the base member 1003c.

It is preferable that the reflective films 1003d have high reflectivity in a wavelength range from 480 nm to 700 nm, for example. The reflective films 1003d are, for example, metal films such as aluminum films or gold films. Alternatively, for example, the reflective films 1003d are multi-layer reflective films formed by multiple layers of a dielectric material such as aluminum oxide or titanium oxide.

The adhesive applied on the concave parts of the lens fixing member 1003b is applied on the reflective films 1003d, for example. When adhesive is used, it is desirable to select an adhesive having high transmission property with respect to the converted light 51 be selected. It is desirable to use an adhesive with high transmittance with respect to the converted light 51 be adopted.

In FIG. 3C, the retroreflective optical member 9 is of a lens-embedded type. In FIG. 3B, entrance surfaces of the spherical lenses 1003a are exposed on the lens fixing member 1003b. Namely, the spherical lenses 1003a protrude from the lens fixing member 1003b. However, as illustrated in FIG. 3C, the spherical lenses 1003a may be embedded in a transparent resin 1003e. Namely, the spherical lenses 1003a may be disposed to be submerged in the transparent resin 1003e.

In addition, in FIG. 3C, a gap is formed between the spherical lens 1003a and the reflective film 1003d. The gap between the spherical lens 1003a and the reflective film 1003d is filled with the transparent resin 1003e.

The retroreflective optical member 9 illustrated in FIG. 3B does not include the transparent resin 1003e illustrated in FIG. 3C. By contrast, the retroreflective optical member 9 illustrated in FIG. 3C does not include the lens fixing member 1003b illustrated in FIG. 3B.

Considering that the spherical lenses 1003a are to be embedded with the transparent resin 1003e, it is preferable in the case in FIG. 3C that the refractive index n of the spherical lenses 1003a be higher than that in the above-described case of the refractive index n of 2.0, for example.

The refractive index n of the spherical lenses 1003a can be derived by using FIG. 3D.

A distance BFL can be expressed as the following expression (1) by using a focal length EFL and a radius r of the spherical lens 1003a. The distance BFL is the distance from a surface, from which the converted light 51b exits, of the spherical lens 1003a to the focal point on a line connecting the center of the spherical lens 1003a and the focal point. Here, the exit surface is a surface of the spherical lens 1003a facing a surface of the concave reflective film 1003d. In FIG. 3C, the focal point is located on the reflective film 1003d. The focal length EFL is the focal length of the spherical lens 1003a. Namely, the focal length is the distance from the center of the spherical lens 1003a to the focal point. The radius r is the radius of the spherical lens 1003a.

$$BFL = EFL - r \quad (1)$$

In addition, the focal length EFL can be expressed as the following expression (2) by using a refractive index $n_1$ of the transparent resin 1003e and a refractive index $n_2$ of the spherical lens 1003a.

$$EFL = \frac{n_2 r}{2(n_2 - n_1)} \quad (2)$$

Specific calculation of the refractive index n will be performed.

For example, it is assumed that the distance BFL is 20 μm, the radius r of the spherical lens 1003a is 50 μm, and the refractive index $n_1$ of the transparent resin 1003e is 1.5. In this case, by using expression (1) and expression (2), the refractive index $n_2$ of the spherical lens 1003a can be calculated to be 2.33. Namely, under the above conditions, glass material whose refractive index $n_2$ is 2.33 can be selected.

In addition, as illustrated in FIG. 3B, when the spherical lenses 1003a are exposed on the lens fixing member 1003b and the spherical lenses 1003a are in contact with the reflective films 1003d, expression (2) can be solved by setting the refractive index $n_1$ to 1.0, which is the refractive index in a vacuum, and by setting the value of the focal length EFL to be equal to the radius r of the spherical lens 1003a. In this case, the refractive index $n_2$ of the spherical lens 1003a is 2.0.

FIGS. 4A to 4D show configuration diagrams illustrating variations of the retroreflective optical member 9 according to embodiment 1. In the variations, instead of the spherical lenses 1003a, microprisms are arranged in an array. Microprisms are extremely small prisms, e.g., minute prisms obtained by performing precision machining on optical glass. Instead of microprisms, micromirrors having equivalent reflective surfaces may be arranged in an array. The micromirrors may be shaped like a polyhedron, for example. Alternatively, the micromirrors may be shaped like a dome, for example. Alternatively, the micromirrors may have a spherical surface shape, for example.

Figure 4B:
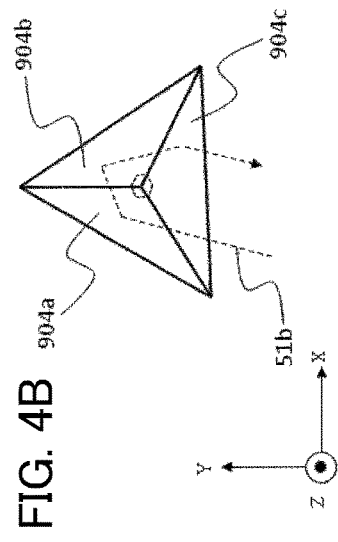
FIGS. 4A to 4D show explanatory diagrams illustrating variations of the retroreflective optical member according to embodiment 1.
Figure 4D:
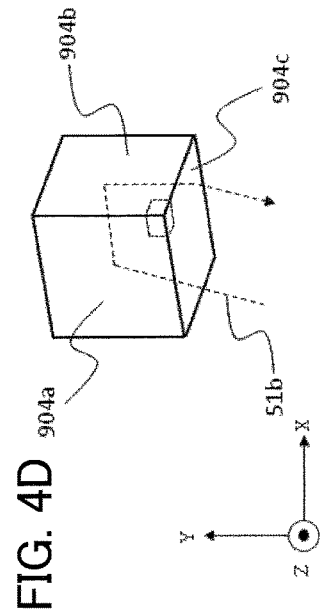
Figure 4A:
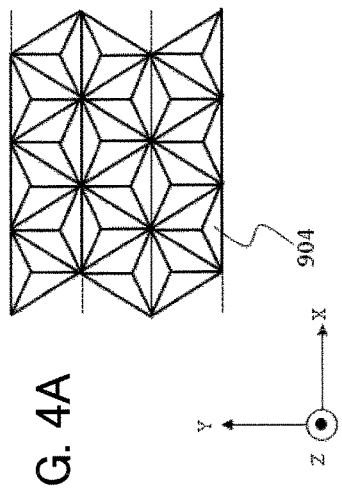
Figure 4C:
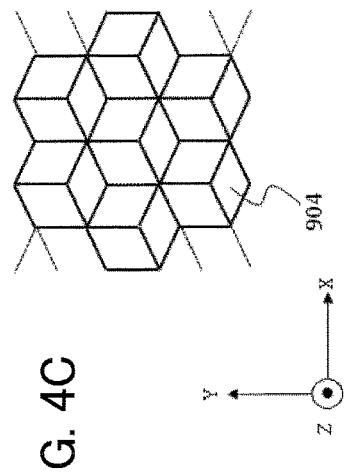

FIG. 4A is a configuration diagram of a retroreflective optical member 904 viewed from the +Z axis direction; the retroreflective optical member 904 includes an array of microprisms that are triangular pyramids. FIG. 4B is a schematic diagram in which a part in FIG. 4A is enlarged. FIG. 4C is a configuration diagram of the retroreflective optical member 904 viewed from the −Z axis direction; the retroreflective optical member 904 is formed by imitating a single angle in a cube and performing prism processing. FIG. 4D is a schematic diagram in which a part in FIG. 4C is enlarged.

Reflective surfaces 904a, 904b, and 904c of a microprism are mirror surfaces. Alternatively, the reflective surfaces 904a, 904b, and 904c are surfaces on which reflection processing is performed. Namely, the reflective surfaces 904a, 904b, and 904c are reflective surfaces.

Hereinafter, an optical path of the converted light 51b will be described with reference to FIG. 4B.

First, the converted light 51b is reflected by the reflective surface 904a. The converted light 51b reflected by the reflective surface 904a is reflected by the reflective surface 904b. The converted light 51b reflected by the reflective surface 904b is reflected by the reflective surface 904c. The converted light 51b reflected by the reflective surface 904c is emitted from the retroreflective optical member 904. The converted light 51b reflected by the reflective surface 904c is in parallel to the converted light 51b that has been incident on the reflective surface 904a.

Finally, the retroreflective optical member 904 emits light parallel to the light incident on the microprism. Namely, the retroreflective optical member 904 can realize retroreflection through three reflections. An optical path and a reflection mechanism in FIG. 4D are the same as those in FIG. 4B.

For example, like the spherical lenses 1003a described above, microprisms and micromirrors are disposed on a surface of a fixing member. The fixing member corresponds to the lens fixing member 1003b.

(Light Ray Tracking Simulation)

Light ray tracking simulations are performed by using the wavelength conversion member 3 or the retroreflective optical member 9 and results of the simulations will be described.

The simulations described below are performed under the following conditions of the component elements.

A thickness B1 in the Z axis direction of the phosphor part 4a of the wavelength conversion member 4 is 0.1 mm. A thickness B2 in the Z axis direction of the phosphor supporting member 4b of the wavelength conversion member 4 is 0.5 mm. Here, the refractive index of the glass material of the phosphor supporting member 4b is 1.765.

The retroreflective optical member 9 is that includes the spherical lenses 1003a with the entrance surfaces showing above the lens fixing member 1003*b*, as illustrated in FIG. 3B. The radius r of the spherical lens 1003*a* is 50 μm. The refractive index n of the glass material of the retroreflective optical member 9 is 1.902.

The diameter D1 of the condensed light spot 8*a* of the excitation light 50 is 0.6 mm.

In the simulations, an evaluation surface is the exit surface 4*ao* (+Z axis side surface) of the phosphor part 4*a*. The exit surface 4*ao* of the phosphor part 4*a* is, for example, the surface of the phosphor part 4*a* on the +Z axis side in FIG. 2A or FIG. 2B. The exit surface is, for example, a surface parallel to the XY plane.

In the simulations, of the converted light 51 isotropically radiated from the condensed light spot 8, only the converted light 51*b* radiated in the −Z direction and reflected by the wavelength selection member 3 or the retroreflective optical member 9 in the +Z direction is evaluated.

The following four patterns are used, as the configurations of the wavelength conversion member 4 used in the simulations.

In pattern 1, the following conditions are used. The wavelength conversion member 4 does not include the phosphor supporting member 4*b*. For example, the wavelength conversion member 4 includes only the phosphor part 4*a*. In addition, the converted light 51*b* is reflected by the wavelength selection member 3.

The distance from the surface of the wavelength selection member 3 on the +Z axis direction side to the surface of the phosphor part 4*a* on the −Z axis direction side is 0.5 mm. Namely, there is a gap of 0.5 mm between the wavelength selection member 3 and the wavelength conversion member 4. The gap corresponds to the thickness B2 in FIG. 2A. However, as described above, the phosphor supporting member 4*b* is not present.

In pattern 2, the following conditions are used. The wavelength conversion member 4 includes the phosphor part 4*a* and the phosphor supporting member 4*b*. The converted light 51*b* is reflected by the wavelength selection member 3.

The distance from the surface of the wavelength selection member 3 on the +Z axis direction side to the surface of the phosphor supporting member 4*b* on the −Z axis direction side is 0.5 mm. Namely, there is a gap of 0.5 mm between the wavelength selection member 3 and the wavelength conversion member 4. In pattern 2, unlike that in FIG. 2A, the wavelength selection member 3 is disposed away from the wavelength conversion member 4.

In pattern 3, the following conditions are used. The wavelength conversion member 4 does not include the phosphor supporting member 4*b*. For example, the wavelength conversion member 4 includes only the phosphor part 4*a*. The converted light 51 is reflected by the retroreflective optical member 9.

The distance from an end part of the retroreflective optical member 9 on the +Z axis direction side to a surface of the phosphor part 4*a* on the −Z axis direction side is 0.5 mm. This end part is an end part of a spherical lens 1003*a* on the +Z axis side. Namely, there is a gap of 0.5 mm between the retroreflective optical member 9 and the wavelength conversion member 4. The gap between the retroreflective optical member 9 and the phosphor part 4*a* is 0.5 mm.

In pattern 4, the following conditions are used. The wavelength conversion member 4 includes the phosphor part 4*a* and the phosphor supporting member 4*b*. The converted light 51 is reflected by the retroreflective optical member 9.

A distance G from the end part of the retroreflective optical member 9 on the +Z axis direction side to the surface (the entrance surface Obi) of the phosphor supporting member 4*b* on the −Z axis direction side is 0.5 mm. This end part is the end part of the spherical lens 1003*a* on the +Z axis side. Namely, there is a gap of 0.5 mm between the retroreflective optical member 9 and the wavelength conversion member 4. The gap between the retroreflective optical member 9 and the phosphor supporting member 4*b* is 0.5 mm.

Figure 5A:
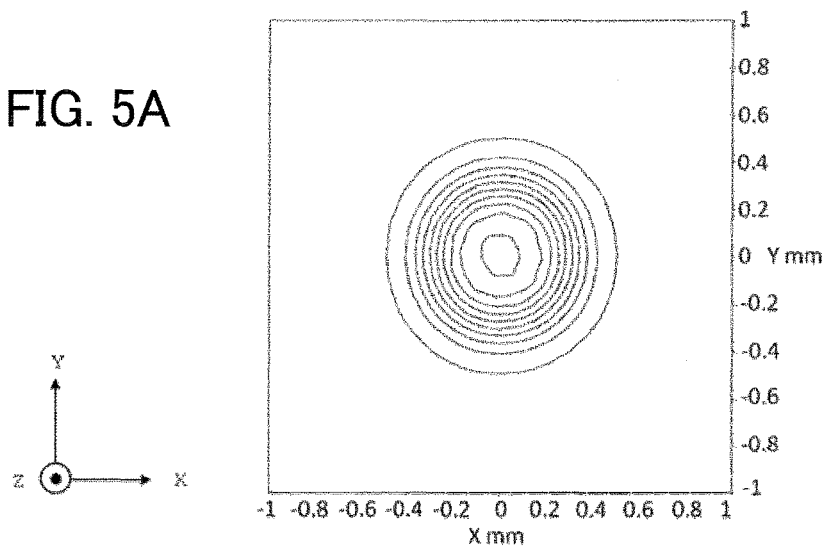
FIGS. 5A and 5B show explanatory diagrams illustrating a result of a light ray simulation of pattern 1 in an embodiment described in patent reference 1.
Figure 5B:
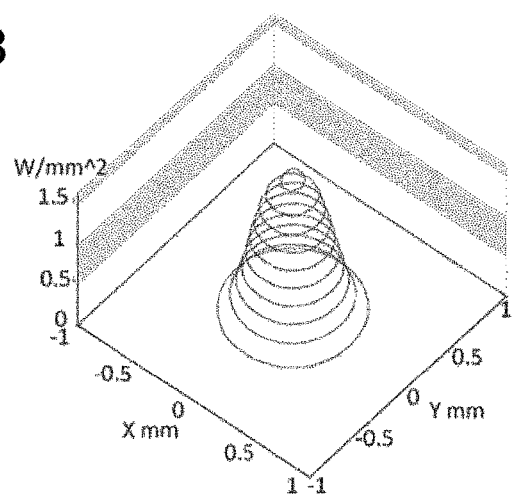
Figure 6A:
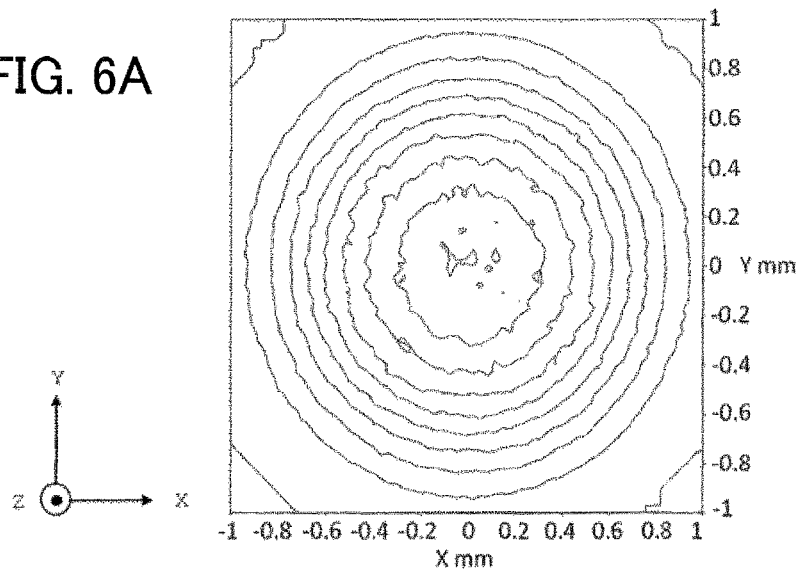
FIGS. 6A and 6B show explanatory diagrams illustrating a result of a light ray simulation of pattern 2 in the embodiment described in patent reference 1.
Figure 6B:
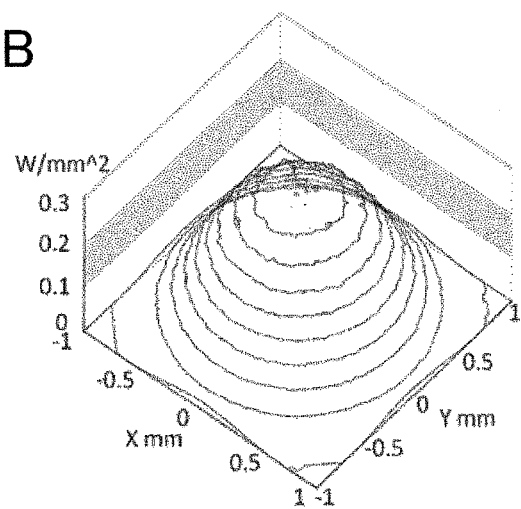
Figure 7A:
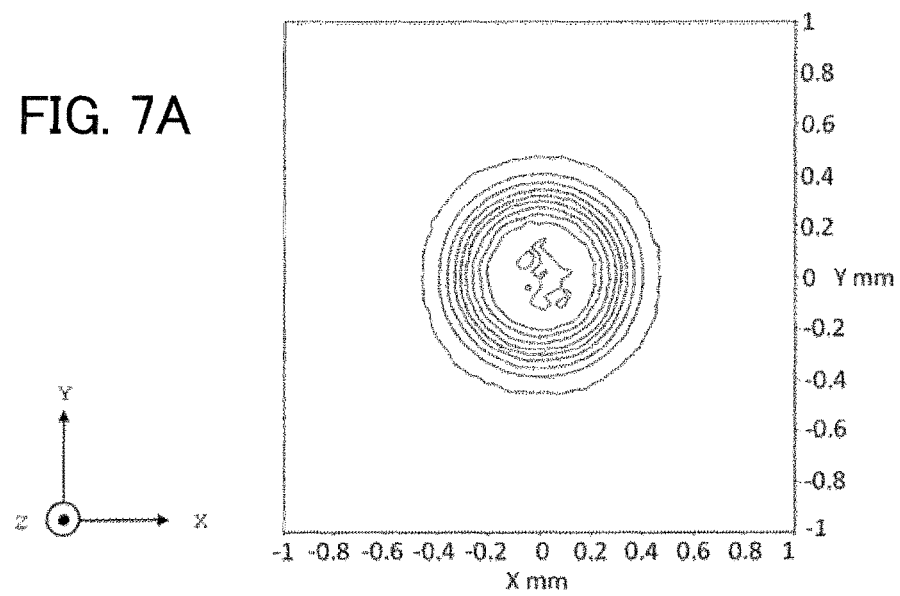
FIGS. 7A and 7B show explanatory diagrams illustrating a result of a light ray simulation of pattern 1 in embodiment 1.
Figure 7B:
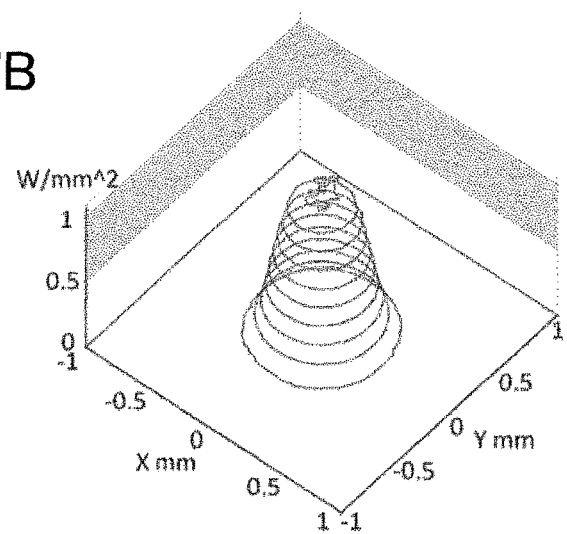
Figure 8A:
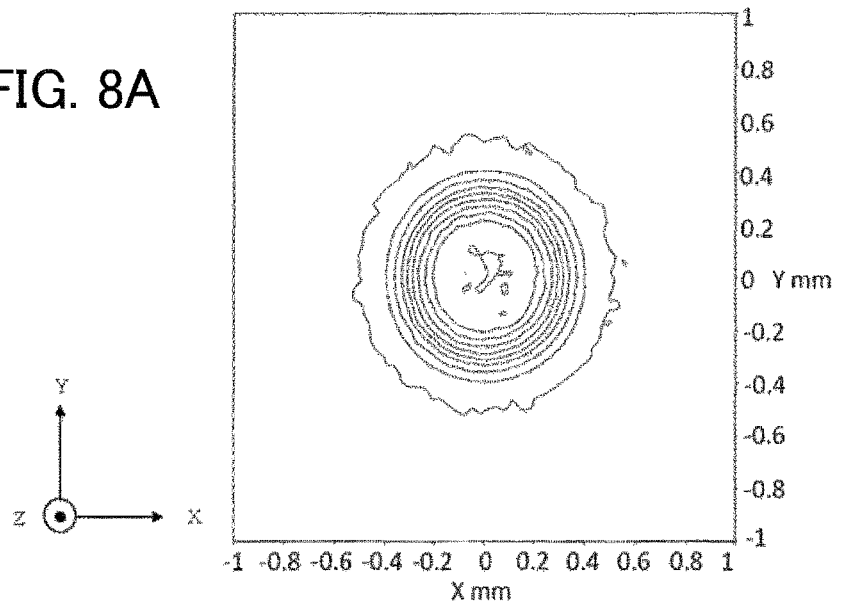
FIGS. 8A and 8B show explanatory diagrams illustrating a result of a light ray simulation of pattern 2 in embodiment 1.
Figure 8B:
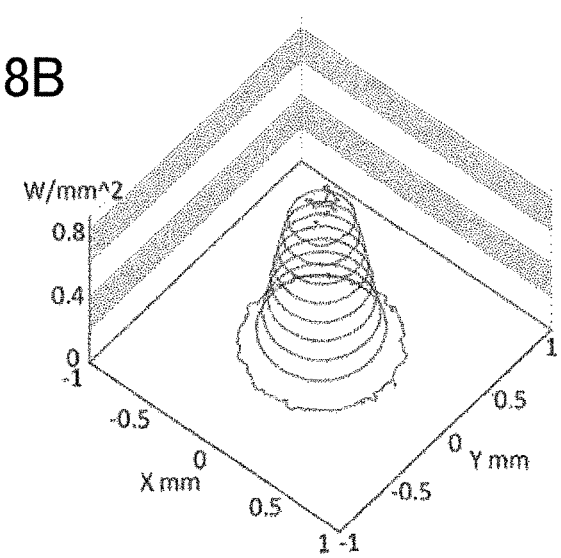

FIGS. 5A and 5B show explanatory diagrams illustrating a result of the light ray tracking simulation under the conditions of pattern 1. FIGS. 6A and 6B show explanatory diagrams illustrating a result of the light ray tracking simulation under the conditions of pattern 2. FIGS. 7A and 7B show shows explanatory diagrams illustrating a result of the light ray tracking simulation under the conditions of pattern 3. FIGS. 8A and 8B show shows explanatory diagrams illustrating a result of the light ray tracking simulation under the conditions of pattern 4.

In FIG. 5A, FIG. 6A, FIG. 7A, and FIG. 8A, contours of illuminance values on the evaluation surface are illustrated as planes. In FIG. 5A, FIG. 6A, FIG. 7A, and FIG. 8A, the horizontal axis indicates the distance (mm) in the X axis direction, and the vertical axis indicates the distance (mm) in the Y axis direction. In FIG. 5A, FIG. 6A, FIG. 7A, and FIG. 8A, the illuminance value at the center part is highest.

In FIG. 5B, FIG. 6B, FIG. 7B, and FIG. 8B, the contours of the illuminance values on the evaluation surface are illustrated in three dimensions. In FIG. 5B, FIG. 6B, FIG. 7B and FIG. 8B, in addition to the distance in the X axis direction and the distance in the Y axis direction, the vertical axis indicates the amount of the radiation (W/mm$^2$).

The diameter of the condensed light spot 8*a* of the converted light 51*b* on the evaluation surface in each of the simulations is as follows. The diameter of the condensed light spot 8 is 0.6 mmΦ.

As illustrated in FIGS. 5A and 5B, the result of pattern 1 indicates that the diameter of the condensed light spot 8*a* is 1.0 mmΦ. As illustrated in FIGS. 6A and 6B, the result of pattern 2 indicates that the diameter of the condensed light spot 8*a* is 2.0 mmΦ. As illustrated in FIGS. 7A and 7B, the result of pattern 3 indicates that the diameter of the condensed light spot 8*a* is 0.8 mmΦ. As illustrated in FIGS. 8A and 8B, the result of pattern 4 indicates that the diameter of the condensed light spot 8*a* is 1.0 mmΦ.

According to the above results, the following matters are known.

First, the diameter of the condensed light spot 8*a* can be made closer to that of the condensed light spot 8 in the cases that the retroreflective optical member 9 is used (patterns 3 and 4), than in the cases that the wavelength selection member 3 is used (patterns 1 and 2). Namely, the color unevenness can be suppressed.

Second, in the cases that the retroreflective optical member 9 is used (patterns 3 and 4), the thickness of the wavelength conversion member 4 in the Z axis direction less affects the diameter of the condensed light spot 8*a*. Namely, the diameter of the condensed light spot 8*a* is difficult to be affected by the distance from the retroreflective optical member 9 to the phosphor part 4*a*.

Embodiment 2

FIG. 9 is a configuration diagram schematically illustrating main components of a vehicle lamp device 109 according to embodiment 2 of the present invention. Hereinafter, embodiment 2 of the present invention will be described with reference to the drawings.

Embodiment 2 differs from embodiment 1 in a configuration of a retroreflective optical member 909. In embodiment 2, the same component elements as those in embodiment 1 will be denoted by the same reference characters, and description thereof will be omitted.

The same component elements as those in embodiment 1 are the semiconductor light-emitting element 2, the condenser optical member 5, the wavelength conversion member 4, and the projection optical member 6. The wavelength conversion member 4 includes the phosphor part 4a and the phosphor supporting member 4b.

(Configuration of Retroreflective Optical Member 909)

A configuration of the retroreflective optical member 909 will be described.

The retroreflective optical member 909 includes a transmission part 909b and a wavelength selection coating 909a. The transmission part 909b transmits light having the same wavelength as that of the excitation light 50. Namely, the transmission part 909b transmits the excitation light 50. On an exit surface side (+Z axis side) of the transmission part 909b, a concave surface shape is formed. Hereinafter, this concave surface shape will be referred to as a "concave surface".

On the concave surface, the wavelength selection coating 909a is formed. The wavelength selection coating 909a transmits light having the same wavelength as that of the excitation light 50. The wavelength selection coating 909a reflects light having the same wavelength as that of the converted light 51. Namely, the wavelength selection coating 909a transmits the excitation light 50. The wavelength selection coating 909a reflects the converted light 51.

In FIG. 9, for example, the retroreflective optical member 909 is disposed to be in contact with the phosphor supporting member 4b. The retroreflective optical member 909 is disposed on the −Z axis side of the phosphor supporting member 4b.

Figure 10A:
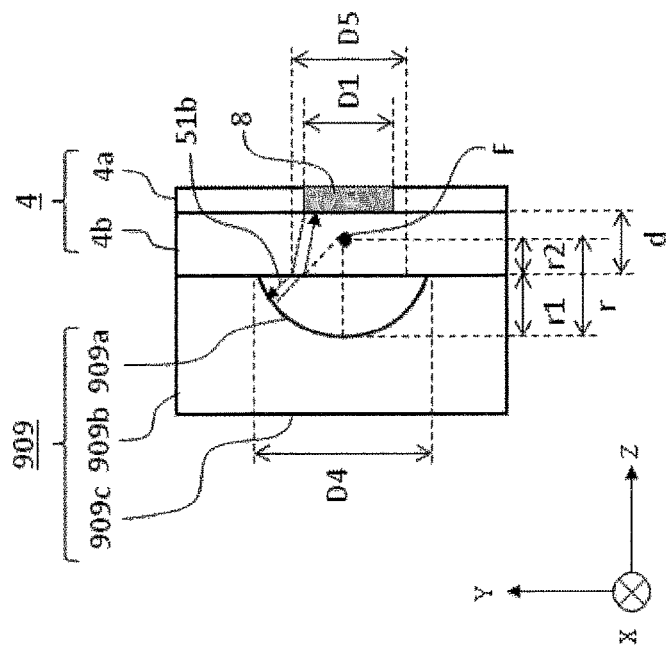
FIGS. 10A and 10B show detail views illustrating a retroreflective structure according to embodiment 2.
Figure 10B:
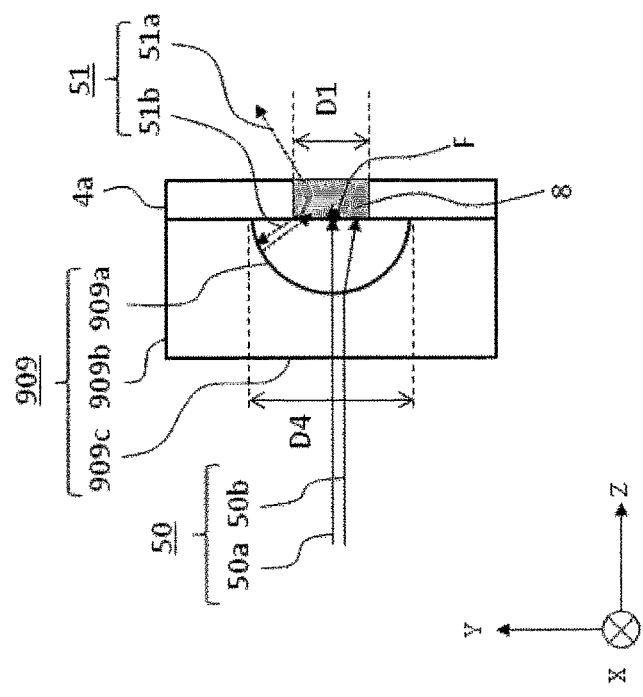

FIGS. 10A and 10B and FIG. 11 are configuration diagrams of retroreflective structures according to the present embodiment 2. FIG. 10A is a configuration diagram showing a case in which the wavelength conversion member 4 does not include the phosphor supporting member 4b. For example, it is a configuration diagram showing a case in which the wavelength conversion member 4 includes only the phosphor part 4a. FIG. 10B is a configuration diagram showing a case in which the wavelength conversion member 4 includes the phosphor part 4a and the phosphor supporting member 4b. FIG. 11 is a configuration diagram illustrating an example of another structure of the retroreflective optical member 909.

A concave surface in the configuration illustrated in FIG. 10A will be described.

The excitation light 50 is condensed on the phosphor part 4a by the condenser optical member 5. Then, the excitation light 50 is converted into the converted light 51 by the phosphor part 4a. The converted light 51 is radiated isotropically from the condensed light spot 8, for example.

In this case, a diameter D4 of the concave surface of the transmission part 909b is larger than a diameter D1 of the condensed light spot 8. This relationship of D4>D1 allows most of the converted light 51b radiated in the −Z axis direction to be retroreflected toward the condensed light spot 8 by the concave surface. Namely, the relationship of D4>D1 is preferable in terms of the light utilization efficiency.

In addition, the curvature of the concave surface is determined so that a focal point F of the retroreflected converted light 51b is positioned on the condensed light spot 8. FIG. 10A shows the concave surface shaped like a spherical surface, for example. The radius of the concave surface is a radius r, for example. However, the concave surface may have a non-spherical shape, an ellipsoidal surface shape, etc.

The focal point of the concave surface is disposed at the position of the phosphor part 4a. In this way, the retroreflected converted light 51b can be returned within the region of the condensed light spot 8. As illustrated in FIG. 10B, if the retroreflected converted light 51b is refracted by the phosphor supporting member 4b, the position of the focal point is determined by taking this refraction of the converted light 51b into consideration.

A concave surface in the configuration illustrated in FIG. 10B will be described.

The configuration illustrated in FIG. 10B differs from the configuration illustrated in FIG. 10A in that the phosphor supporting member 4b is provided. The optical path of the converted light 51b varies according to a thickness d of the phosphor supporting member 4b in the Z axis direction. The optical path of the converted light 51b also varies according to a refractive index n of the phosphor supporting member 4b.

The converted light 51b radiated in the −Z axis direction from the condensed light spot 8 is radiated to the retroreflective optical member 909 through the phosphor supporting member 4b. In this case, on the surface of the phosphor supporting member 4b on the −Z axis side, a diameter D5 of the luminous flux of the converted light 51b is larger than the diameter D1 of the condensed light spot 8. The difference between the diameter D5 and the diameter D1 depends on the length of the optical path of the converted light 51b from entering to exiting from the phosphor supporting member 4b. Namely, the difference between the diameter D5 and the diameter D1 depends on the thickness d of the phosphor supporting member 4b in the Z axis direction and the refractive index n of the phosphor supporting member 4b.

In this case, the diameter D4 of the concave surface of the transmission part 909b is larger than the diameter D5. This relationship of D4>D5 enables most of the converted light 51b radiated in the −Z axis direction to be retroreflected toward the condensed light spot 8 by the concave surface. The diameter of the spot emitted to the concave part from the phosphor supporting member 4b is the diameter D5. Namely, the relationship of D4>D5 is preferable in terms of the light utilization efficiency.

The diameter D4 is twice the radius r (D4=2r). Namely, in FIG. 10A, the center (the focal point F) of the spherical surface shape of the concave part is positioned on the surface of the phosphor part 4a on the −Z axis side. However, the center (focal point F) of the spherical surface shape of the concave part may be positioned inside the phosphor part 4a.

Thus, it is preferable that the diameter D1, the diameter D4, and the diameter D5 have a relationship of D4>D5>D1.

The curvature of the concave surface in the configuration illustrated in FIG. 10B will be described.

When the concave surface has a spherical surface shape, the curvature (the average curvature) of the concave surface having the radius r is 1/r. Further, a distance r2 can be expressed as d/n. Namely, the distance r2 is a value obtained by dividing the thickness d of the phosphor supporting member 4b by the refractive index n of the phosphor supporting member 4b.

The distance r2 is the shortest distance from the focal point F to the surface of the phosphor supporting member 4b on the −Z axis direction side. The refractive index n is the refractive index of the phosphor supporting member 4b. The thickness d is the thickness of the phosphor supporting member 4b in the Z axis direction. The radius r is given by the following expression (3).

$$r = r_1 + \frac{d}{n} \quad (3)$$

In this case, a distance r1 is a variable value. Depending on the value of the distance r1, the values of the radius r and the diameter D4 of the concave surface vary. However, in terms of the light utilization efficiency, it is preferable that the value of the distance r1 be set so that the value of the radius r achieves a relationship of D5<D4 between the diameter D5 and the diameter D4 of the concave surface.

FIG. 10B illustrates the concave surface shaped like a spherical surface, for example. However, the concave surface may have a non-spherical surface shape, an ellipsoidal surface shape, or the like.

In this case, like in the case of the spherical surface shape, the position of the focal point F is determined from the thickness d of the phosphor supporting member 4b and the refractive index n. The curvature of the concave surface is set to a value that allows the light to be condensed on the focal point F. Alternatively, the concave surface is formed to have a shape that allows the light to be condensed on the focal point F. For the shape of the concave surface, a toroidal surface or a cylindrical surface can be used, for example. Using these shapes enables the shape of the condensed light spot 8 to be an ellipse shape.

In FIGS. 10A and 10B, an entrance surface 909c, on which the excitation light 50 is incident, of the retroreflective optical member 909 is illustrated as a flat surface, for example. The entrance surface 909c, on which the excitation light 50 is incident, is a surface of the retroreflective optical member 909 on the −Z axis direction side. In addition, the entrance surface 909c, on which the excitation light 50 is incident, is parallel to the XY plane, for example.

However, when the excitation light 50 is incident as parallel light, the excitation light 50 is refracted at the concave surface to become wider, as indicated by excitation light 50b illustrated in FIG. 10A. The concave surface is coated with the wavelength selection coating 909a. Consequently, the diameter D1 of the condensed light spot 8 is increased.

In this case, as illustrated in FIG. 11, the entrance surface 909c of the retroreflective optical member 909 on the −Z axis direction side is famed in a convex surface shape. Thus, the retroreflective optical member 909 is formed to have a shape of a meniscus lens.

FIG. 11 is a configuration diagram illustrating another example of the retroreflective structure according to embodiment 2 and illustrates an example of a case of the retroreflective optical member 909 having a shape of a meniscus lens.

The surface 909c, on which the excitation light 50 is incident, of the retroreflective optical member 909 has a lens surface of positive power. The entrance surface 909c of the transmission part 909b has the lens surface of positive power.

In FIG. 11, the excitation light 50a is a light ray in a center part of luminous flux. The excitation light 50b is a light ray in a peripheral part of the luminous flux. The excitation light 50a is parallel to the excitation light 50b.

When passing through the convex surface part of the entrance surface 909c, the excitation light 50a is not refracted. Further, when passing through the concave surface part, the excitation light 50a is not refracted. By contrast, when passing through the convex surface part of the entrance surface 909c, the excitation light 50b is refracted in a direction in which it approaches the excitation light 50a. When passing through the concave surface part, the excitation light 50b is refracted in a direction in which it becomes parallel to the excitation light 50a.

By forming a region, through which the excitation light 50a and 50b pass, to have a shape of a meniscus lens, it is possible to reduce expanding in the diameter D1 of the condensed light spot 8. A "meniscus lens" is a crescent-shaped lens having a convex surface on one surface thereof and a concave surface on the other surface thereof.

The configuration in FIG. 10A will be treated as pattern 1 in embodiment 2. The configuration in FIG. 10B will be treated as pattern 2 in embodiment 2.

Figure 12A:
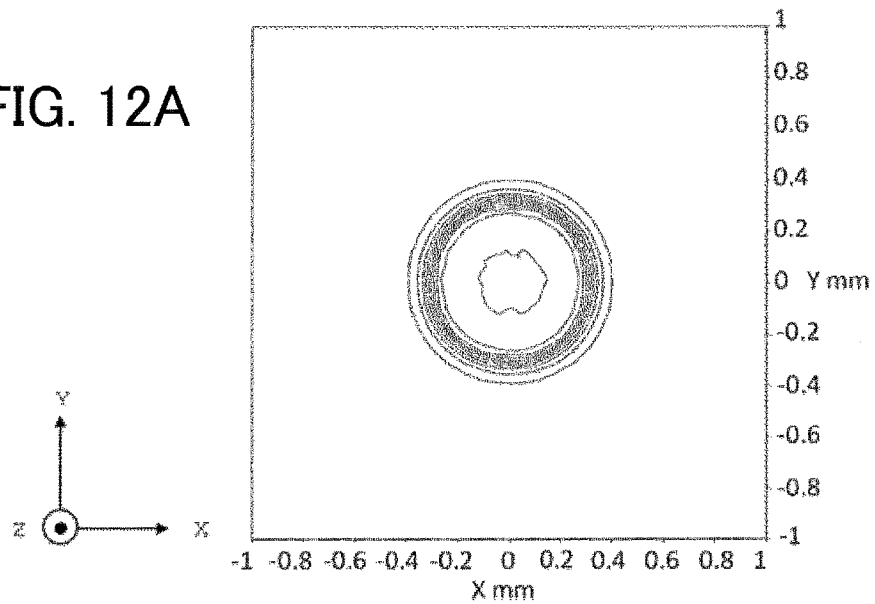
FIGS. 12A and 12B show explanatory diagrams illustrating a result of a light ray simulation of pattern 1 in embodiment 2.
Figure 12B:
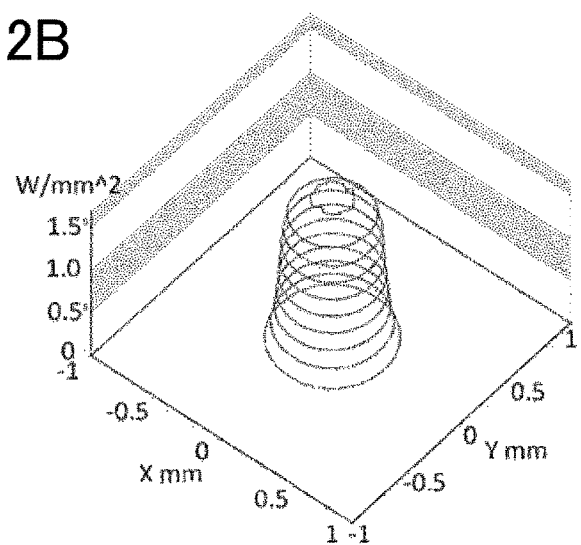
Figure 13A:
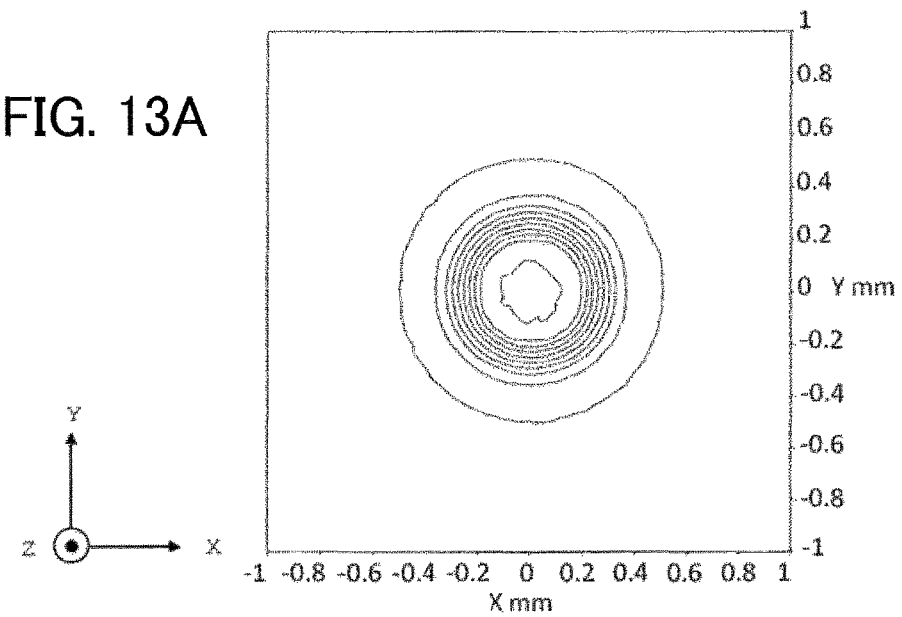
FIGS. 13A and 13B show explanatory diagrams illustrating a result of a light ray simulation of pattern 2 in embodiment 2.
Figure 13B:
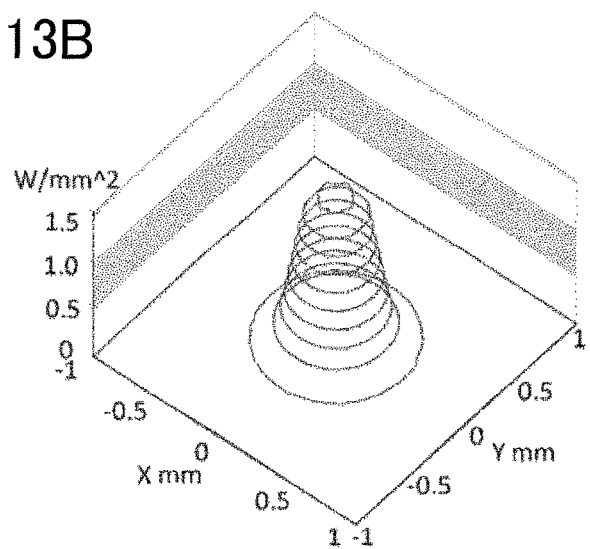

FIGS. 12A and 12B show explanatory diagrams illustrating a result of a light ray tracking simulation under the conditions of pattern 1. FIGS. 13A and 13B show explanatory diagrams illustrating a result of a light ray tracking simulation under the conditions of pattern 2.

In FIG. 12A and FIG. 13A, contours of illuminance values on an evaluation surface are illustrated as planes. In FIG. 12A and FIG. 13A, the horizontal axis indicates the distance (mm) in the X axis direction, and the vertical axis indicates the distance (mm) in the Y axis direction. In FIG. 12A and FIG. 13A, the illuminance value at the center part is highest.

In FIG. 12B and FIG. 13B, the contours of the illuminance values on the evaluation surface are illustrated in three dimensions. In FIG. 12B and FIG. 13B, in addition to the distance (mm) in the X axis direction and the distance (mm) in the Y axis direction, the vertical axis indicates the amount of the radiation (W/mm$^2$).

In pattern 1, the concave surface is made to satisfy the following conditions: the center of curvature is the focal point F of the concave surface, the radius of curvature is 0.4 mm, and the curvature is 2.5. Under these conditions, the relationship between the diameter D1 and the diameter D4 satisfies the condition of D4>D1.

In pattern 2, the concave surface is made to satisfy the following conditions: the center of curvature is the focal point F of the concave surface, the radius of curvature (r in FIG. 10B) is 0.7 mm, and the curvature is 1.43. The phosphor supporting member 4b is a sapphire substrate having the refractive index n of 1.765 and the thickness d in the Z direction of 0.5 mm. From a relationship of r2=d/n, the distance r2 is 0.283 mm. In addition, the focal point position F of the concave surface can be derived. Under the above conditions, the relationship among the diameter D1, the diameter D4, and diameter D5 satisfies a condition of D4>D5>D1.

The diameter of the condensed light spot 8a of the converted light 51b on the evaluation surface in each of the simulations is as follows. The diameter of the condensed light spot 8 is 0.6 mmΦ.

As illustrated in FIGS. 12A and 12B, the result of pattern 1 indicates that the diameter of the condensed light spot 8a is 0.8 mmΦ. As illustrated in FIGS. 13A and 13B, the result of pattern 2 indicates that the diameter of the condensed light spot 8a is 0.1 mmΦ.

Namely, when the simulation results according to embodiment 2 illustrated in FIGS. 12A and 12B and FIGS. 13A and 13B are compared with the simulation results illustrated in FIGS. 5A and 5B and FIGS. 6A and 6B, it can be understood that expanding in the diameters of the condensed light spot 8a in the results in FIGS. 12A and 12B and FIGS. 13A and 13B are smaller than that in the results in FIGS. 5A and 5B and FIGS. 6A and 6B.

In addition, when the retroreflective optical member 909 is used, the thickness of the wavelength conversion member 4 in the Z axis direction less affects the diameter of the condensed light spot 8a.

As described in embodiment 2, according to the configuration in FIG. 9, of the converted light 51 radiated from the condensed light spot 8, the converted light 51b radiated in the −Z direction can be retroreflected toward the condensed light spot 8 by the retroreflective optical member 909. Thus, the light utilization efficiency of the light source device 1090 or the vehicle lamp device 109 can be improved. The converted light 51 is radiated isotropically from the phosphor part 4a, for example.

Further, according to the configuration in FIG. 9, the color unevenness that occurs on the illuminated surface 7 can be reduced. As described above, the color unevenness occurs on the illuminated surface 7 when part of the converted light 51b retroreflected to travel in the +Z direction by the retroreflective optical member 909 is radiated from the periphery of the condensed light spot 8.

Furthermore, according to the configuration in FIG. 9, on the phosphor part 4a, the size of the light source image (the condensed light spot 8) formed by the excitation light 50 is equivalent to the size of the light source image (the condensed light spot 8a) formed by the converted light 51b.

Moreover, on the phosphor part 4a, the angle of radiation of the converted light 51b is equivalent to the angle of radiation of the converted light 51a. The converted light 51 is radiated isotropically from the phosphor part 4a.

In addition, the luminous surface of the phosphor part 4a and the illuminated surface 7 are at optically conjugate positions. The focal point of the projection optical member 6 is located on a surface including the luminous surface of the phosphor part 4a. In this case, the light source image on the phosphor part 4a is projected on the illuminated surface 7.

Thus, the light source device 1090 having high luminous intensity can be obtained. Thus, the color unevenness that occurs on the illuminated surface 7 can be reduced.

Embodiment 3

Figure 14:
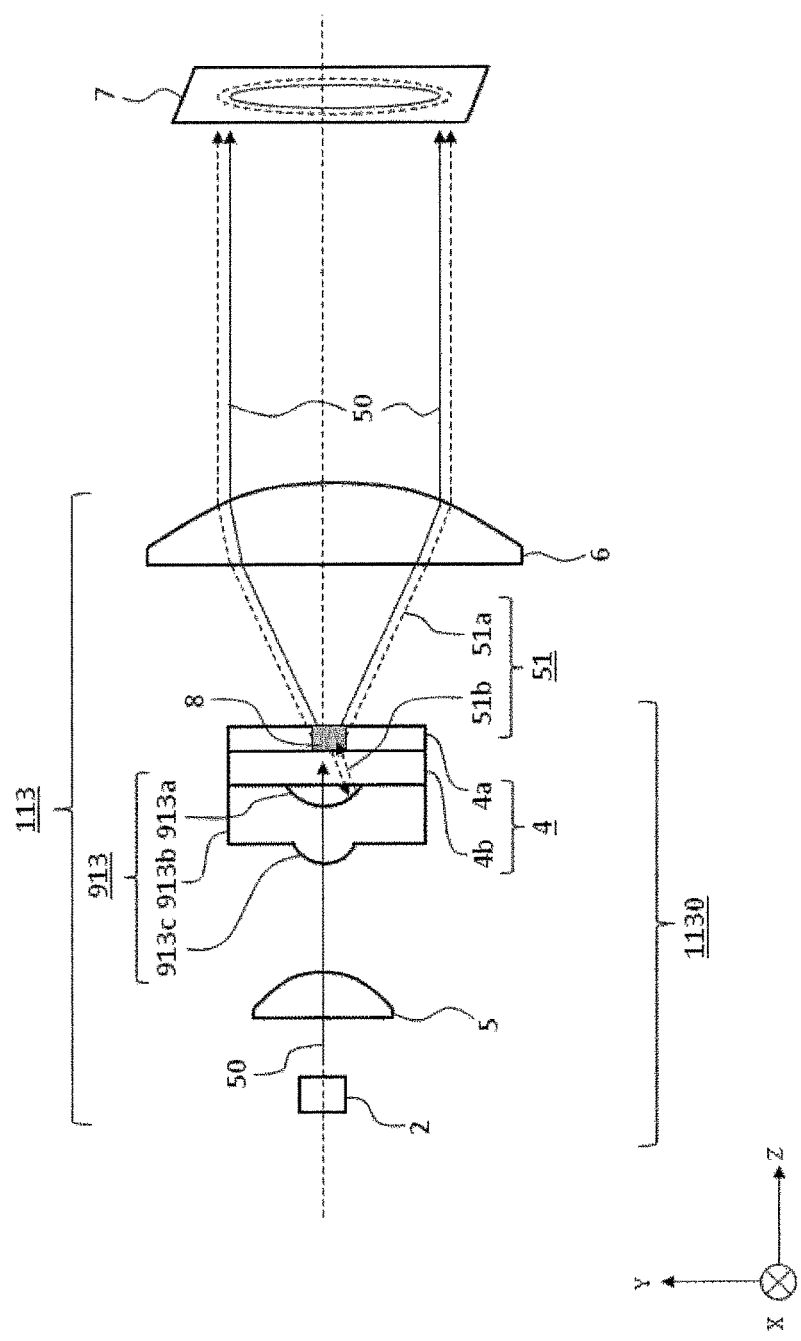
FIG. 14 is a configuration diagram schematically illustrating main components of a vehicle lamp device according to embodiment 3 of the present invention.

FIG. 14 is a configuration diagram schematically illustrating main components of a vehicle lamp device 113 according to embodiment 3 of the present invention. Hereinafter, embodiment 3 of the present invention will be described with reference to the drawings.

Embodiment 3 differs from embodiment 2 in a configuration of a retroreflective optical member 913. In embodiment 3, the same component elements as those in embodiment 2 will be denoted by the same reference characters, and description thereof will be omitted.

The same component elements as those in embodiment 2 are the semiconductor light-emitting element 2, the condenser optical member 5, the wavelength conversion member 4, and the projection optical member 6. The wavelength conversion member 4 includes the phosphor part 4a and the phosphor supporting member 4b.

A configuration of the retroreflective optical member 913 will be described.

The retroreflective optical member 913 includes a wavelength selection coating 913a, a transmission part 913b, and an entrance surface 913c.

The transmission part 913b transmits light having the same wavelength as that of the excitation light 50. Namely, the transmission part 913b transmits the excitation light 50. On the exit surface side (+Z axis side) of the transmission part 913b, a concave surface is formed. In addition, on a surface of the concave surface, the wavelength selection coating 913a is formed. A convex surface is formed on the entrance surface 913c side (−Z axis side) of the transmission part 913b. The convex surface of the entrance surface 913c is a surface through which the excitation light 50 enters the retroreflective optical member 913. For example, in FIG. 14, the entrance surface 913c has a convex surface shape.

The transmission part 913b has the same configuration as that of the transmission part 909b illustrated in FIG. 11. In addition, the wavelength selection coating 913a is the same as the wavelength selection coating 909a illustrated in FIG. 9. Thus, description of the transmission part 913b and the wavelength selection coating 913a will be omitted.

In FIG. 14, for example, the retroreflective optical member 913 is disposed to be in contact with the wavelength conversion member 4. The retroreflective optical member 913 is in contact with the phosphor supporting member 4b.

Effects of embodiment 3 will be described.

Figure 15:
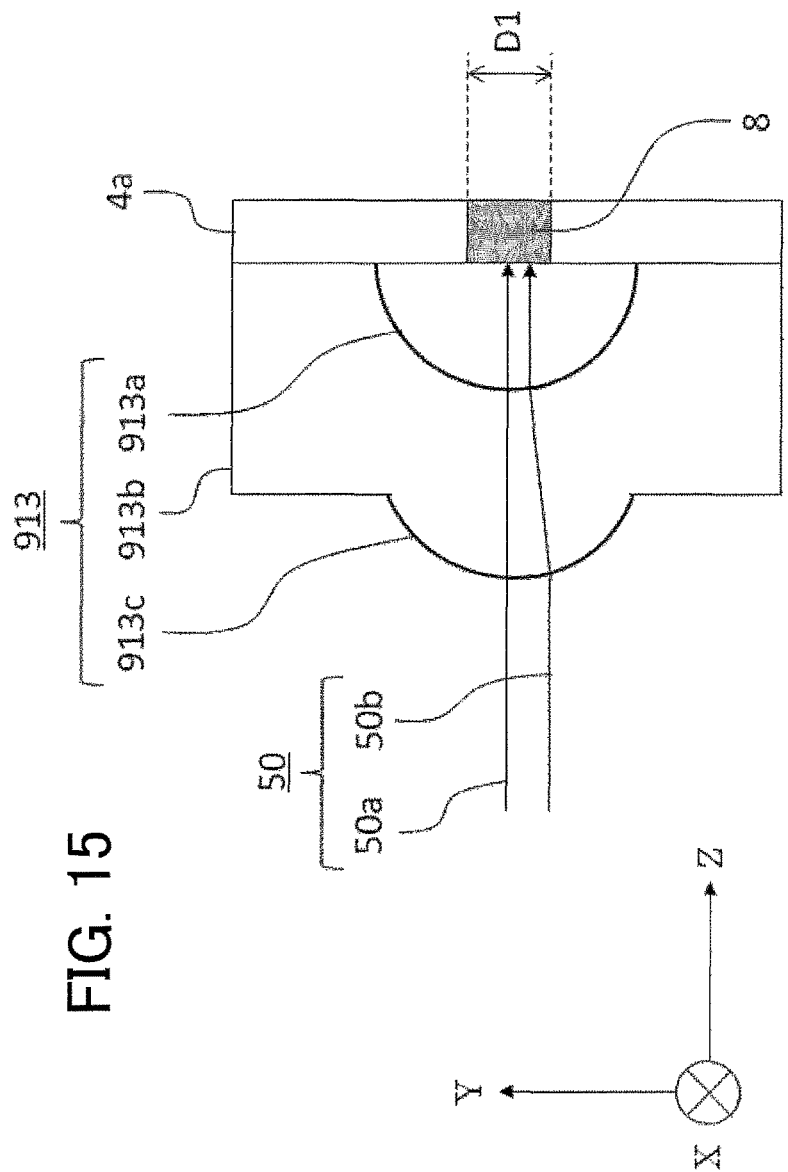
FIG. 15 is a configuration diagram of a retroreflective optical member according to embodiment 3 of the present invention.

FIG. 15 is a configuration diagram of the retroreflective optical member 913 according to the present embodiment 3. The configuration in FIG. 15 is similar to that in FIG. 11 according to embodiment 2. In FIG. 15, the wavelength conversion member 4 does not include the phosphor supporting member 4b. For example, the wavelength conversion member 4 is formed by only the phosphor part 4a.

In FIG. 10, the entrance surface 909c, on which the excitation light 50 is incident, of the retroreflective optical member 909 is illustrated as a flat surface. The entrance surface 909c, on which the excitation light 50 is incident, is the surface on the −Z axis direction side of the retroreflective optical member 909. In addition, the entrance surface 909c, on which the excitation light 50 is incident, is parallel to the XY plane, for example.

However, when the excitation light 50 is incident as parallel light, the excitation light 50 is refracted at the concave surface to become wider, as indicated by the excitation light 50b illustrated in FIG. 10A. The concave surface is coated with the wavelength selection coating 909a. Consequently, the diameter D1 of the condensed light spot 8 is made larger than the diameter of the incident parallel light.

In this case, as in the retroreflective optical member 913 illustrated in FIG. 15, the entrance surface 913c on the −Z axis direction side is formed to have a convex surface shape. Namely, the entrance surface 913c has a convex surface shape.

In FIG. 15, for example, the convex surface shape of the entrance surface 913c is illustrated as a spherical surface shape. However, the convex surface shape may be a non-spherical surface shape or an ellipsoidal surface shape. Alternatively, a cylindrical shape having a convex surface shape may be used. The cylindrical shape is a shape that makes light converge or diverge in only one direction. Further, an ellipsoidal surface is a quadric surface, whose cross section taken along a plane parallel to each of three coordinate planes is always an ellipse.

By forming the entrance surface 913c to have a convex surface shape, it is possible to reduce expanding in the diameter D1 of the condensed light spot 8. Namely, on the phosphor part 4a, a light source having high luminous intensity can be obtained.

Figure 16:
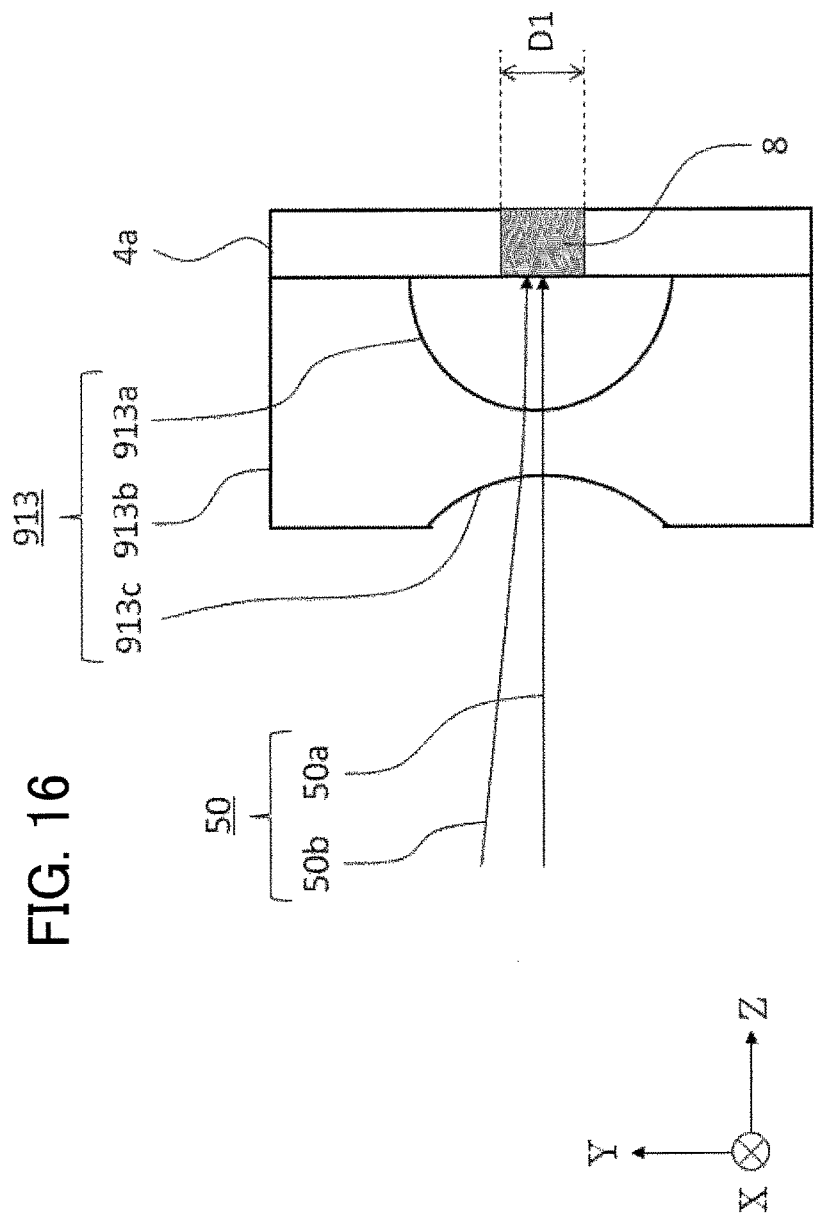
FIG. 16 is an explanatory diagram illustrating a variation of the retroreflective optical member according to embodiment 3 of the present invention.

FIG. 16 is an explanatory diagram illustrating a variation of the retroreflective optical member according to the present embodiment 3. In FIG. 16, the wavelength conversion member 4 does not include the phosphor supporting member 4b. For example, the wavelength conversion member 4 includes only the phosphor part 4a.

For example, in FIG. 16, the excitation light 50 is incident on the retroreflective optical member 913 as it is condensed on the retroreflective optical member 913. In this case, as in the retroreflective optical member 913 illustrated in FIG. 16, the entrance surface 913c on the −Z axis direction side is formed to have a concave surface shape. Namely, the entrance surface 913c has a concave surface shape.

The surface 913c, on which the excitation light 50 is incident, of the retroreflective optical member 913 has a lens surface of negative power. The entrance surface 913c of the transmission part 913b has the lens surface of negative power.

In FIG. 16, for example, the concave surface shape of the entrance surface 913c is illustrated as a spherical surface shape. However, the concave surface shape may be a non-spherical surface shape or an ellipsoidal surface shape. Alternatively, a cylindrical shape having a concave surface shape may be used.

When the excitation light 50 is incident on the retroreflective optical member 913 so as to be condensed on the retroreflective optical member 913, it is possible to reduce expanding in the diameter D1 of the condensed light spot 8 by forming the entrance surface 913c to have a concave surface shape. Namely, on the phosphor part 4a, a light source having high luminous intensity can be obtained.

Thus, as described in embodiment 3, with the configuration of the retroreflective optical member 913 illustrated in FIG. 15 or FIG. 16, it is possible to reduce expanding of the condensed light spot 8 formed by the excitation light 50. Namely, on the phosphor part 4a, a light source having high luminous intensity can be obtained.

In addition, with the configuration of the retroreflective optical member 913 illustrated in FIG. 15 or FIG. 16, it is possible to adjust an intensity distribution formed by the excitation light 50 on the condensed light spot 8. For example, by adjusting the shape of the entrance surface 913c, a Gaussian beam can be changed into a top-hat beam.

The light intensity distribution of the Gaussian beam is an approximate Gaussian distribution. Namely, in the Gaussian beam, the energy density is the highest at a center of the intensity distribution. The light intensity distribution of a top-hat beam is an even distribution. Namely, a top-hat beam has an even energy density in intensity distribution.

By adjusting the excitation light 50 to form a top-hat beam, the energy density can be made even on the phosphor part 4a. Namely, heat emission on the phosphor part 4a can be reduced. Thus, damage due to the heat on the phosphor part 4a can be prevented. In addition, decrease in the amount of light emitted by the phosphor part 4a due to heat can be prevented.

Thus, a light source device 1130 having high luminous intensity can be obtained. In addition, the reliability of the light source device 1130 can be improved.

In the above embodiments, there are cases in which terms indicating a positional relationship between components or a shape of a component, such as "parallel", "above", "below", or the like, are used. These terms indicate that a range covering manufacturing tolerance, assembly variations, etc. is included. Thus, when a statement indicating a positional relationship between components or a shape of a component is given in the claims, it indicates that a range covering manufacturing tolerance, assembly variations, etc. is included.

Further, while embodiments of the present invention have been described as above, the present invention is not limited to these embodiments.

On the basis of the above embodiments, the contents of the present invention will hereinafter be described as APPENDIX-(1) and APPENDIX-(2). Reference characters assigned in APPENDIX-(1) are independent of those assigned in APPENDIX-(2). Thus, for example, "appendix 1" exists in each of APPENDIX-(1) and APPENDIX-(2)).

APPENDIX-(1)

Appendix 1

A light source device including:
a semiconductor light-emitting element to emit excitation light;
a condenser optical member to condense the excitation light;
a wavelength conversion member that is irradiated with the excitation light condensed by the condenser optical member and radiates converted light having a wavelength different from a wavelength of the excitation light; and
a retroreflective optical member that is disposed between the condenser optical member and the wavelength conversion member and has a retroreflective property,
wherein the retroreflective optical member reflects the converted light radiated to the retroreflective optical member from a region on the wavelength conversion member that is irradiated with the excitation light, to the region.

Appendix 2

A vehicle lamp device including:
the light source device according to appendix 1; and
a projection optical member,
wherein the excitation light and the converted light are projected by the projection optical member.

Appendix 3

A light source device including:
a semiconductor light-emitting element to emit excitation light;
a condenser optical member to condense the excitation light;
a wavelength conversion member to which the excitation light condensed by the condenser optical member is emitted and which emits converted light having a wavelength different from a wavelength of the excitation light; and
a retroreflective optical member that is disposed between the condenser optical member and the wavelength conversion member and has a retroreflective property,
wherein the retroreflective optical member includes: an exit surface through which the excitation light exits and which is formed as a concave surface; and a wavelength selection coating which is formed on a surface of the concave surface and has a property of transmitting the excitation light and reflecting the converted light; the retroreflective optical member reflects the converted light radiated to the retroreflective optical member from a region on the wavelength conversion member that is irradiated with the excitation light, to the region.

Appendix 4

The light source device according to appendix 3, wherein the retroreflective optical member includes an entrance surface, through which the excitation light enters and which is an convex surface, thereby having a meniscus shape.

Appendix 5

A vehicle lamp device including:
the light source device according to appendix 3 or 4; and
a projection optical member,
wherein the excitation light and the converted light are projected by the projection optical member.

APPENDIX-(2)

Appendix 1

A light source device (1000) including:
a light source to emit excitation light;
a wavelength conversion member including a first region which is irradiated with the excitation light, converted light having a wavelength different from a wavelength of the excitation light being radiated from the first region; and
a retroreflective optical member to reflect the converted light to the first region,
wherein the first region is a region that is a part of the wavelength conversion member.

Appendix 2

The light source device according to appendix 1, wherein the retroreflective optical member includes a spherical lens that retroreflects the converted light.

Appendix 3

The light source device according to appendix 2, comprising a fixing member holding the spherical lens,
wherein the fixing member has a concave part for holding the spherical lens.

Appendix 4

The light source device according to appendix 3, wherein a reflective film is formed on the concave part.

Appendix 5

The light source device according to appendix 3 or 4, wherein
the fixing member is formed to surround the converted light emitted from the wavelength conversion member toward the light source, and
the spherical lens is disposed on a surface of the fixing member formed to surround the converted light.

Appendix 6

The light source device according to appendix 1, wherein the retroreflective optical member includes microprisms arranged in an array that retroreflect the converted light.

Appendix 7

The light source device according to appendix 6, including a fixing member holding the microprisms, wherein the fixing member includes concave parts for holding the microprisms.

Appendix 8

The light source device according to appendix 7, wherein
the fixing member is formed to surround the converted light emitted from the wavelength conversion member toward the light source, and
the microprisms are disposed on a surface of the fixing member formed to surround the converted light.

Appendix 9

The light source device according to appendix 1, wherein the retroreflective optical member includes micromirrors arranged in an array that retroreflect the converted light.

Appendix 10

The light source device according to appendix 9, wherein each of the micromirrors has a polyhedral shape.

Appendix 11

The light source device according to appendix 9, wherein each of the micromirrors has a domical shape.

Appendix 12

The light source device according to appendix 9, wherein each of the micromirrors has a spherical surface shape.

Appendix 13

The light source device according to any one of appendixes 9 to 12, comprising a fixing member holding the micromirrors.

Appendix 14

The light source device according to appendix 13, wherein
the fixing member is formed to surround the converted light emitted from the wavelength conversion member toward the light source, and
the microprisms are disposed on a surface of the fixing member formed to surround the converted light.

Appendix 15

The light source device according to any one of appendixes 3, 4, 5, 7, 8, 13, and 14, wherein the fixing member includes a first transmission part that allows the excitation light to pass through.

Appendix 16

The light source device according to appendix 15, wherein the excitation light emitted from the light source passes through the first transmission part and reaches the wavelength conversion member.

Appendix 17

The light source device according to appendix 15 or 16, wherein the first transmission part is an opening.

Appendix 18

The light source device according to appendix 15 or 16, wherein the first transmission part is formed by a member that transmits the excitation light.

Appendix 19

The light source device according to appendix 1, wherein the retroreflective optical member has a concave surface shape that retroreflects the excitation light.

Appendix 20

The light source device according to appendix 19, wherein
the retroreflective optical member includes a second transmission part that allows the excitation light to pass through, and
the concave surface shape is formed on the second transmission part.

Appendix 21

The light source device according to appendix 19 or 20, wherein a wavelength selection film that allows the excitation light to pass through and reflects the converted light is formed on the concave surface shape.

Appendix 22

The light source device according to any one of appendixes 19 to 21, wherein the second transmission part includes a second region on which the excitation light is incident and the second region is provided with a lens surface of positive power.

Appendix 23

The light source device according to appendix 22, wherein the excitation light incident on the second transmission part is parallel light.

Appendix 24

The light source device according to any one of appendixes 19 to 21, wherein the second transmission part includes a second region on which the excitation light is incident and the second region is provided with a lens surface of negative power.

Appendix 25

The light source device according to appendix 24, wherein the excitation light incident on the second transmission part is condensed light.

Appendix 26

The light source device according to any one of appendixes 19 to 25, wherein the concave surface shape is a spherical surface shape.

Appendix 27

The light source device according to appendix 26, wherein a focal point of the spherical surface shape is located in a region that is a region on the wavelength conversion member and converts the excitation light into the converted light.

Appendix 28

The light source device according to any one of appendixes 1 to 27, wherein the retroreflective optical member is disposed between the light source and the wavelength conversion member.

Appendix 29

The light source device according to any one of appendixes 1 to 28, comprising a condenser optical member that condenses the excitation light emitted from the light source.

Appendix 30

The light source device according to appendix 29, wherein the condenser optical member makes an incident region when condensed luminous flux reaches the wavelength conversion member smaller than an incident region when luminous flux reaches the condenser optical member.

Appendix 31

The light source device according to appendix 30, wherein
the luminous flux and the condensed luminous flux are circular in cross section, and
a luminous flux diameter of the condensed luminous flux at a time of reaching the wavelength conversion member is made smaller than a luminous flux diameter of the luminous flux at a time of reaching the condenser optical member.

Appendix 32

The light source device according to appendix 30 or 31, wherein the wavelength conversion member is a phosphor part 4a.

Appendix 33

The light source device according to any one of appendixes 29 to 32, wherein when the excitation light is emitted from the condenser optical member, divergence angles of the excitation light differ in two directions that are perpendicular to an optical axis of the condenser optical member and orthogonal to each other.

Appendix 34

The light source device according to appendix 33, wherein the condenser optical member is a toroidal lens.

Appendix 35

The light source device according to any one of appendixes 29 to 34, wherein the condenser optical member is disposed between the light source and the retroreflective optical member.

Appendix 36

The light source device according to any one of appendixes 29 to 35, wherein the condenser optical member is a condenser lens.

Appendix 37

A lighting apparatus including:
the light source device according to any one of appendixes 1 to 36; and
a projection optical member that projects a luminous pattern formed on the wavelength conversion member.

Appendix 38

The lighting apparatus according to appendix 37, wherein the luminous pattern is formed on an exit surface side of the phosphor part.

Appendix 39

A vehicle lamp device comprising the lighting apparatus according to appendix 37 or 38.

DESCRIPTION OF REFERENCE CHARACTERS 1, 109, 113 vehicle lamp device; 1000, 1001, 1090, 1130 light source device; 2 semiconductor light-emitting element; 3 wavelength selection member; 4 wavelength conversion member; 4a phosphor part; 4ao exit surface; 4b phosphor supporting member; Obi entrance surface; 5, 5a condenser optical member; 6 projection optical member; 7 illuminated surface; 8, 8a condensed light spot; 9, 904, 909, 913 retroreflective optical member; 9a retroreflection part; 909a, 913a wavelength selection coating; 9b, 909b, 913b transmission part; 909c, 913c entrance surface; 50, 50a, 50b excitation light; 51, 51a, 51b converted light; 51c synthesized light; 1003a spherical lens; 1003b lens fixing member; 1003c base member; 1003d reflective film; 1003e transparent resin; B1, B2 thickness; G distance; D1, D2, D3, D4, D5 diameter; BFL, EFL distance; F focal point; n refractive index; r radius; r1, r2 distance; S cross section.

What is claimed is:

1. A light source device comprising:
a light source to emit excitation light;
a wavelength conversion member including a first region which is irradiated with the excitation light, converted light having a wavelength different from a wavelength of the excitation light being emitted from the first region; and
a retroreflective optical member to reflect the converted light to the first region, wherein
the first region is a region that is a part of the wavelength conversion member,
the retroreflective optical member includes a spherical lens that retroreflects the converted light and a fixing member holding the spherical lens,
the fixing member has a concave part for holding the spherical lens,
the fixing member is formed to surround the converted light radiated from the wavelength conversion member toward the light source, and
the spherical lens is disposed on a surface of the fixing member formed to surround the converted light.

2. The light source device according to claim 1, wherein the fixing member includes a first transmission part that allows the excitation light to pass through.

3. A light source device comprising:
a light source to emit excitation light;
a wavelength conversion member including a first region which is irradiated with the excitation light, converted light having a wavelength different from a wavelength of the excitation light being emitted from the first region; and
a retroreflective optical member to reflect the converted light to the first region, wherein
the first region is a region that is a part of the wavelength conversion member,
the retroreflective optical member has a concave surface that retroreflects the converted light emitted from the wavelength conversion member and traveling toward the concave surface,
the retroreflective optical member includes a transmission part that allows the excitation light to pass through, and
the concave surface is formed on the transmission part.

4. The light source device according to claim 1, comprising a condenser optical member to condense the excitation light emitted from the light source.

5. The light source device according to claim 4, wherein the condenser optical member makes an incident region when condensed luminous flux reaches the wavelength conversion member smaller than an incident region when luminous flux reaches the condenser optical member.

6. The light source device according to claim 4, wherein divergence angles of the excitation light at a time of emission from the condenser optical member are different in two directions that are perpendicular to an optical axis of the condenser optical member and orthogonal to each other.

7. A lighting apparatus comprising:
the light source device according to claim 1; and
a projection optical member that projects a luminous pattern formed on the wavelength conversion member.

8. A vehicle lamp device comprising the lighting apparatus according to claim 7.

9. The light source device according to claim 3, comprising a condenser optical member to condense the excitation light emitted from the light source.

10. The light source device according to claim 9, wherein the condenser optical member makes an incident region when condensed luminous flux reaches the wavelength conversion member smaller than an incident region when luminous flux reaches the condenser optical member.

11. The light source device according to claim 9, wherein divergence angles of the excitation light at a time of emission from the condenser optical member are different in two directions that are perpendicular to an optical axis of the condenser optical member and orthogonal to each other.

12. A lighting apparatus comprising:
the light source device according to claim 3; and
a projection optical member that projects a luminous pattern formed on the wavelength conversion member.

13. A vehicle lamp device comprising the lighting apparatus according to claim 12.

14. The light source device according to claim 3, wherein the retroreflective optical member further has a wavelength selection coating that is formed on the concave surface, allows the excitation light to pass through, and retroreflects the converted light.

15. A light source device comprising:
a light source to emit excitation light;
a wavelength conversion member including a first region which is irradiated with the excitation light, converted light having a wavelength different from a wavelength of the excitation light being emitted from the first region; and
a retroreflective optical member to reflect the converted light to the first region, wherein the first region is a region that is a part of the wavelength conversion member, the retroreflective optical member has a concave surface that retroreflects the converted light, the retroreflective optical member includes a transmission part that allows the excitation light to pass through, the retroreflective optical member is disposed on an optical path and between the light source and the wavelength conversion member, and the concave surface is formed on the transmission part.

16. The light source device according to claim 15, comprising a condenser optical member to condense the excitation light emitted from the light source.

17. The light source device according to claim 16, wherein the condenser optical member makes an incident region when condensed luminous flux reaches the wavelength conversion member smaller than an incident region when luminous flux reaches the condenser optical member.

18. The light source device according to claim 16, wherein divergence angles of the excitation light at a time of emission from the condenser optical member are different in two directions that are perpendicular to an optical axis of the condenser optical member and orthogonal to each other.

19. A lighting apparatus comprising:

the light source device according to claim 15; and a projection optical member that projects a luminous pattern formed on the wavelength conversion member.

20. The light source device according to claim 15, wherein the retroreflective optical member further has a wavelength selection coating that is formed on the concave surface, allows the excitation light to pass through, and retroreflects the converted light.

* * * * *